United States Patent
Hori et al.

(10) Patent No.: US 7,223,449 B2
(45) Date of Patent: May 29, 2007

(54) FILM DEPOSITION METHOD

(75) Inventors: Takanobu Hori, Hyogo (JP); Hiroshi Kajiyama, Ibaraki (JP); Akira Kato, Ibaraki (JP)

(73) Assignees: Shinmaywa Industries, Ltd., Hyogo, Iakarazuka-shi; Hitachi, Ltd., Chiyoda-ku, Tokyo ( * ) Notice: Subject to any disclaimer, the term of this patent is extended or adjusted under 35 U.S.C. 154(b) by 116 days.

(21) Appl. No.: 10/858,178

(22) Filed: Jun. 1, 2004

(65) Prior Publication Data

US 2004/0226509 A1 Nov. 18, 2004

Related U.S. Application Data

(62) Division of application No. 10/247,081, filed on Sep. 19, 2002, now abandoned.

(30) Foreign Application Priority Data

Sep. 20, 2001 (JP) ............................. 2001-287114
Mar. 22, 2002 (JP) ............................. 2002-080873

(51) Int. Cl.
*H05H 1/24* (2006.01)
(52) U.S. Cl. .................. 427/569; 427/162; 427/255.39
(58) Field of Classification Search ........... 427/255.39, 427/569, 162
See application file for complete search history.

(56) References Cited

U.S. PATENT DOCUMENTS 5,756,222 A * 5/1998 Bercaw et al. .............. 428/649
6,025,585 A * 2/2000 Holland .................... 250/208.1
6,586,811 B2 * 7/2003 Sekine ....................... 257/432
6,677,549 B2 * 1/2004 Suzuki et al. ........... 219/121.41
6,830,652 B1 * 12/2004 Ohmi et al. ............. 156/345.41
6,875,700 B2 * 4/2005 Kanakasabapathy et al. .... 438/710

FOREIGN PATENT DOCUMENTS

| JP | 63106623 A | * | 5/1988 |
| JP | 04224136 A | * | 8/1992 |
| JP | 08160202 A | * | 6/1996 |
| JP | 09-243802 | | 9/1997 |
| JP | 09-324262 | | 12/1997 |
| JP | 11-106899 | | 4/1999 |
| JP | 2001140067 A | * | 5/2001 |

* cited by examiner

*Primary Examiner*—Bret Chen
(74) *Attorney, Agent, or Firm*—Marshall, Gerstein & Borun LLP

(57) ABSTRACT

A film deposition method and film deposition system for depositing a halogen compound film, capable of depositing such a film while suppressing abuse that occurs due to deficiency of a halogen element even if the halogen element is dissociated from a film material. The halogen compound film is deposited through a process including: evaporating a film material comprising a halogen compound by means of an evaporation source 3; ionizing the evaporated film material with a radio frequency power outputted from a radio frequency power supply unit 11 and supplied through a substrate holder 2; and causing the ionized film material deposit on the substrate 5. A bias voltage outputted from a bias power supply unit 12 and applied to the substrate holder 2 causes halogen ions dissociated from ions of the halogen compound to be incorporated into the film being deposited on the substrate 5.

11 Claims, 18 Drawing Sheets

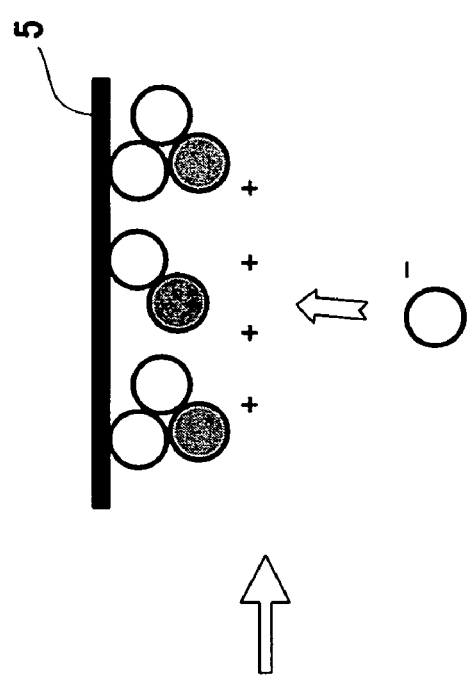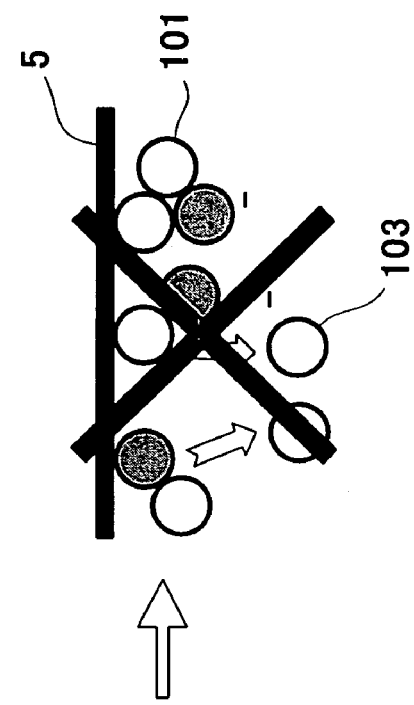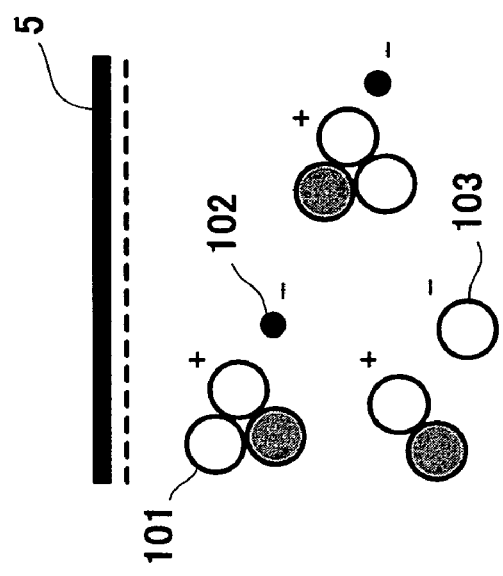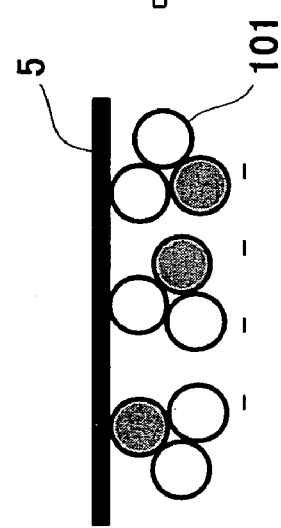
Fig. 10A
Fig. 10B

| | CRYSTAL GRAIN DIAMETER (nm) |
|---|---|
| FILM DEPOSITED AT 300°C | 12~20 |
| NO HEATING OF SUBSTRATE | CRYSTAL GRAIN DIAMETER IS NOT DEFINED |
| APPLY POSITIVE BIAS | 3~10 |

Fig. 14

FILM DEPOSITION METHOD

CROSS REFERENCE TO RELATED APPLICATION

This application is a divisional of application Ser. No. 10/247,081, filed Sep. 19, 2002 now abandoned.

BACKGROUND OF THE INVENTION

The present invention relates to film deposition method.

Optical members such as optical lenses, displays and optical communication members are formed at their surfaces with antireflection coating for lessening a loss in the amount of light or the like due to reflection. In the case where the substrate on which such antireflection coating is to be formed is glass, magnesium fluoride ($MgF_2$) is typically used as the surface layer of the antireflection coating. This is because: magnesium fluoride has a refractive index as low as 1.38 and hence is highly effective in antireflection; a film of magnesium fluoride can be deposited easily by vacuum evaporation; such a magnesium fluoride film has sufficient durability if deposited on a substrate heated to about 300° C.; and a like reason.

If the substrate is formed of a plastic, however, the vacuum evaporation cannot be employed because it is impossible to heat the substrate to such an elevated temperature.

In view of this, a method of forming a magnesium fluoride film using sputtering has been disclosed in Japanese Laid-Open Patent Application Publication No. HEI 9-243802 for example. With the sputtering it is possible to form a dense and hard film on the surface of a substrate without the need of heating the substrate because the energy of the film material popping out of the target in the sputtering is higher than that in the case of the vacuum evaporation.

In the formation of a magnesium fluoride film by sputtering, however, fluorine is dissociated from the film material (magnesium fluoride) due to impact of ions when the film material pops out of the target, thus resulting in a fluorine-deficient film exhibiting an increased light absorption on the surface of the substrate. To avoid this inconvenience the aforementioned film-forming method controls heating of the target to a predetermined high temperature to allow the film material to pop out of the target with its molecular state kept as it is. By so doing the dissociation of fluorine from the film material is prevented, with the result that an increase in light absorption is suppressed.

Thus, the film-forming method employing the sputtering must control the temperature of the target to allow the film material to pop out of the target with its molecular state kept as it is.

Such a problem arises commonly in forming not only magnesium fluoride films but also halogen compound films for use as various optical thin films such as antireflection coating and half mirror coating by the use of the sputtering.

BRIEF SUMMARY OF THE INVENTION

The present invention has been made to resolve the foregoing problem and intends to provide a film deposition method and a film deposition system for depositing a halogen compound film, which are capable of depositing such a film while suppressing adverse effect that occur due to deficiency of a halogen element if the halogen element is dissociated from a film material.

With a view to resolving the foregoing problem, the present invention provides a film deposition method for depositing a halogen compound film, comprising the steps of: placing a substrate on an obverse side of a bias supply electrode disposed in a vacuum chamber; evaporating a film material comprising a halogen compound; supplying a radio frequency voltage to the bias supply electrode used as one of electrodes to generate plasma in the vacuum chamber; and applying to the bias supply electrode a bias voltage varying in the form of a wave having a negative mean value and a maximum value exceeding a self-bias caused by the radio frequency voltage, whereby the evaporated film material is ionized and deposited on the substrate to form the halogen compound film on the substrate.

This method according to the present invention makes it possible to ionize a halogen compound and deposit the ionized film material on a substrate to deposit a film. Even if ions of the halogen element are dissociated from ions of the halogen compound, it is possible to guide such dissociated ions of the halogen element to the substrate and allow such ions to be incorporated into the film to be formed on the substrate by application of the bias voltage varying in the form of a wave having a negative mean value and a maximum value exceeding a self-bias caused by the radio frequency voltage to the bias supply electrode.

Thus, a halogen element, which is easy to dissociate in the form of negative ions, can be incorporated into an intended film being formed through ionization of a halogen compound and, hence, it is possible to prevent the resulting film from being deficient in the halogen element. Further, since the film formation is based on ion plating, it is possible to deposit a film rendered dense.

The maximum value of the bias voltage may be a positive voltage. With this feature it is possible to lessen the deficiency in the halogen element.

The bias voltage may be applied by a power supply.

The bias voltage applied may be based on a voltage generated in a matching circuit provided for matching an impedance on a power supply side associated with the radio frequency voltage to that on a vacuum chamber side. With this feature it is possible to dispense with a dedicated bias power supply.

In the formation of a film based on ion plating which ionizes a film material to generate plasma by means of a radio frequency power, an evaporation source is provided for evaporating the film material, while a coiled ionization electrode is disposed between the evaporation source and the substrate for supplying the radio frequency power, whereby the film material evaporated by the evaporation source can be ionized by being passed through the coiled ionization electrode. Since the deposition of a film according to this feature of the present invention is also based on ion plating, it is also possible to deposit the film rendered dense.

In ionizing the film material in the film formation according to the present invention the film material comprising the halogen compound may be evaporated and ionized in a clustered fashion by cluster ion generating means. This feature allows clustered ions to impinge upon the substrate thereby depositing the film. The application of the bias voltage assuming the aforementioned positive voltage to the bias supply electrode allows ions of the halogen element dissociated from the clustered ions of the halogen compound to be incorporated into the film being deposited on the substrate.

It is possible to employ an arrangement wherein a substrate holder holding the substrate on its back surface in the vacuum chamber is formed of an electrically-conductive material and is used also as the bias supply electrode. This arrangement makes it possible to apply the bias voltage to the substrate holder holding the substrate to be deposited with the film on its back surface and, hence, the bias voltage for causing ions to be incorporated into the film being deposited on the substrate can be applied easily and efficiently.

In the foregoing film deposition method it is possible that an electron beam evaporation source is further provided comprising a crucible holding a material same as the halogen compound to be evaporated, an electron gun for evaporating the halogen compound held in the crucible by heating with an electron beam, and a shutter spaced a predetermined distance from the crucible in a direction toward the substrate, and that the halogen compound in the crucible is evaporated by heating with the electron beam, while direct impingement of the halogen compound thus evaporated upon the substrate is obstructed with the shutter, whereby the evaporated halogen compound is guided sidewardly of the shutter and the crucible.

Since the shutter obstructs the flow of the halogen compound evaporated by the electron beam evaporation source, it is impossible for the evaporated halogen compound to impinge directly upon the substrate. Ions of the halogen element dissociated from the evaporated halogen compound obstructed by the shutter and guided sidewardly of the shutter and the crucible are guided toward the substrate by the bias voltage assuming a positive voltage.

Thus, the amount of ions of the halogen element to be supplied to the substrate can be increased relative to the amount of the evaporated halogen compound and, hence, it is possible to avoid a relative decrease in the amount of the halogen contained in the film to be deposited on the substrate.

Further, since the electron beam evaporation source evaporates the halogen compound by means of the electron beam, the halogen compound can be decomposed more finely, which facilitates the dissociation of ions of the halogen element. This makes it possible to supply such ions of the halogen element to the substrate more easily.

The aforementioned halogen compound may be magnesium fluoride ($MgF_2$). Magnesium fluoride can be formed into an optical thin film. In forming a magnesium fluoride film according to the present invention it is possible to prevent the magnesium fluoride film from becoming deficient in a halogen element. Thus, the present invention is capable of forming a magnesium fluoride film without impairing optical function such as transparency.

The aforementioned bias voltage may have a frequency ranging between 100 kHz and 2.45 GHz. With the bias voltage having such a frequency the halogen element can advantageously be incorporated into the film and prevented from being eliminated from the film.

According to the present invention, there is also provided an apparatus for depositing a halogen compound film, comprising: a vacuum chamber; a bias supply electrode disposed in the vacuum chamber and having an obverse side for receiving a substrate thereon; an evaporation source for evaporating a film material of the halogen compound film to be deposited on the substrate; a radio frequency power supply for supplying a radio frequency voltage to the bias supply electrode used as one of electrodes to generate plasma in the vacuum chamber; and a bias power supply for applying to the bias supply electrode a bias voltage having a frequency ranging between 100 kHz and 2.45 GHz and varying in the form of a wave having a negative mean value and a positive maximum value. This apparatus is capable of incorporating the halogen element into the film and preventing elimination of the halogen element from the film.

According to the present invention, there is also provided a magnesium fluoride film obtainable by a method comprising the steps of: placing a substrate on an obverse side of a bias supply electrode disposed in a vacuum chamber; evaporating magnesium fluoride; supplying a radio frequency voltage to the bias supply electrode used as one of electrodes to generate plasma in the vacuum chamber; and applying to the bias supply electrode a bias voltage having a frequency ranging between 100 kHz and 2.45 GHz and varying in the form of a wave having a negative mean value and a positive maximum value, thereby depositing the magnesium fluoride film on the substrate. The magnesium fluoride film thus obtained is a dense and hard film having a lowered absorption in the visible light region.

The magnesium fluoride film according to the present invention has a crystal grain diameter not less than 3 nm and not more than 10 nm.

The above and further objects and features of the invention will more fully be apparent from the following detailed description with accompanying drawings.

BRIEF DESCRIPTION OF THE SEVERAL VIEWS OF THE DRAWINGS

FIG. 10A is a view illustrating an action of the present invention, specifically the action of incorporating dissociated fluorine ions;

FIG. 10B is a view illustrating an action of the present invention, specifically the action of preventing elimination of fluorine ions;

FIG. 14 is a table showing the crystal grain diameters of magnesium fluoride films;

DETAILED DESCRIPTION OF THE INVENTION

Hereinafter, modes of practicing the present invention will be described with reference to FIGS. 1 to 18.

Figure 1A:
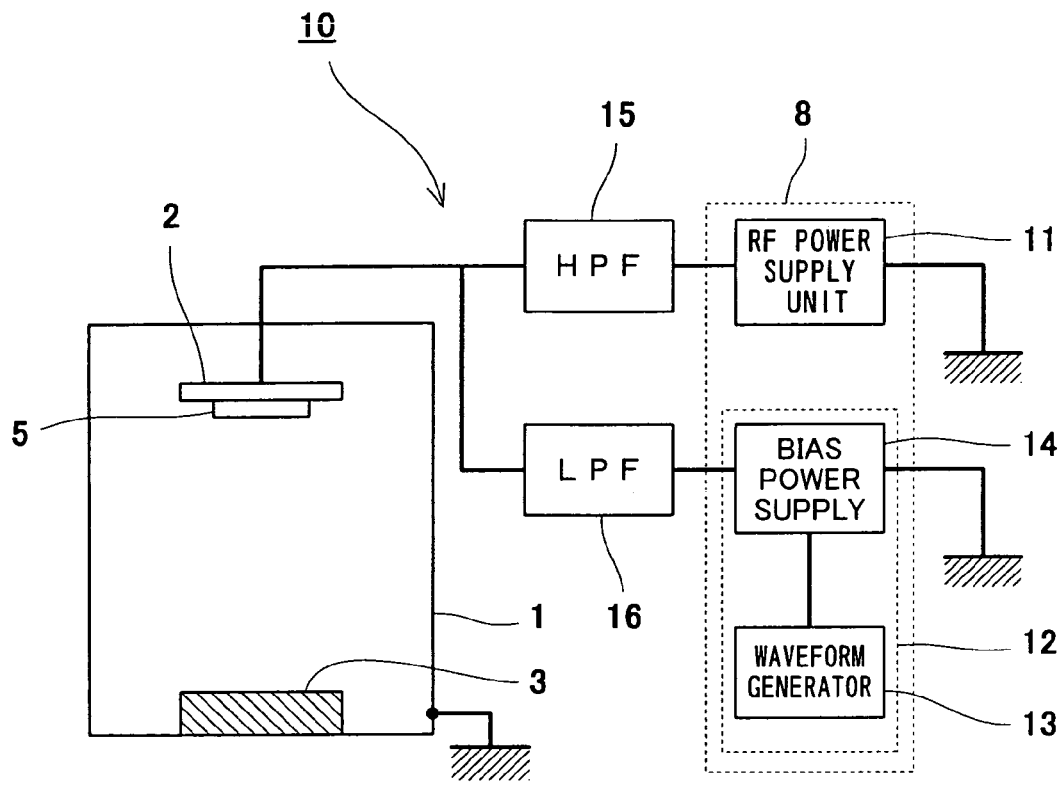
FIG. 1A is a schematic overview of the configuration of a vacuum deposition system capable of practicing the present invention.

FIG. 1A is a schematic overview of the configuration of a film deposition system 10 as one example of such an system capable of practicing the present invention. The film deposition system 10 is configured to deposit films on the basis of ion plating as a film deposition method.

The film deposition system 10 includes a vacuum chamber 1 and a power supply unit 8 comprising a radio frequency (RF) power supply unit 11 and a bias power supply unit 12.

In an upper portion of the inside of the vacuum chamber 1 is disposed a substrate holder 2 for holding a substrate 5 from its reverse side opposite from its obverse side on which a film is to be deposited. In the example shown in FIG. 1A the substrate holder 2 is formed of an electrically-conductive material so that an electric power can be supplied into the vacuum chamber 1. As will be described later, the substrate holder 2 is adapted to be capable of functioning as a bias supply electrode as well as of supplying a radio frequency power.

Further, the substrate holder 2 can be driven for rotatably by means of a motor not shown and, hence, a film can be deposited on the substrate 5 rotated by the substrate holder 2 rotating.

In a lower portion of the inside of the chamber 1 is disposed an evaporation source 3 for holding a film material comprising a halogen compound and evaporating it within the space defined in the chamber 1. As the evaporation source 3 it is possible to use any one of various evaporation sources that are capable of evaporating a film material in the space defined in the chamber 1, including one adapted to evaporate the film material through resistive heating by a heating power supply, one adapted to evaporate the film material through heating with an electron gun, one adapted to evaporate the film material by sputtering, and one adapted to evaporate the film material by arc discharge.

The vacuum chamber 1 is provided with evacuation means such as a vacuum pump and gas supply means, which are not particularly shown, for having a desired vacuum atmosphere therein. That is, the atmosphere within the vacuum chamber 1 can be adjusted to a desired vacuum atmosphere meeting film-depositing conditions established.

Further, the vacuum chamber 1 is formed of an electrically-conductive material and has a chamber wall grounded.

The radio frequency power supply unit 11 supplies an electric power for generating plasma in the chamber 1 to ionize (excite) the film material evaporated from the evaporation source 3. The radio frequency power supply unit 11 has one output terminal connected to the substrate holder 2 through a high pass filter 15 and other output terminal grounded. The radio frequency power outputted from the radio frequency power supply unit 11 is applied to the substrate holder 2.

The high pass filter 15, which is located between the radio frequency power supply unit 11 and the substrate holder 2, permits the power outputted from the radio frequency power supply unit 11 to pass therethrough toward the substrate holder 2 side while blocking the inputting of the power outputted from the bias power supply unit 12 to the radio frequency power supply unit 11.

As to the specific power value and frequency of the power outputted from the radio frequency power supply unit 11, desired power value and frequency are determined to meet the kind of the material of a film to be deposited and film depositing conditions.

Between the radio frequency power supply unit 11 and the high pass filter 15 is disposed a matching box not particularly shown. The matching box includes a well-known matching circuit comprising a capacitor and a coil. Adjustment of the matching box allows matching to be made between the impedance of the radio frequency power supply unit 11 side and that of the vacuum chamber 1 side.

The bias power supply unit 12 comprises a waveform generator 13 and a bias power supply 14. The waveform generator 13 is adapted to generate a waveform of a bias voltage to be outputted from the bias power supply unit 12.

The waveform generator 13 is capable of generating various waveforms such as DC component steadily assuming a constant value, AC components of respective frequencies, square waves and triangular waves as basic components. The waveform generator 13 is also capable of composing a basic waveform based on plural basic components. The bias power supply 14 outputs a bias voltage amplified to a predetermined magnitude of power based on such a basic waveform generated by the waveform generator 13.

The bias power supply 14 has one output terminal connected to the substrate holder 2 through a first low pass filter 16 and other output terminal grounded. The bias voltage outputted from the bias power supply 14 is applied to the substrate holder 2.

The first low pass filter 16, which is located between the bias power supply 14 and the substrate holder 2, permits the power outputted from the bias power supply 14 to pass therethrough toward the substrate holder 2 side while blocking the inputting of the power outputted from the high-frequency power unit 11 to the bias power supply unit 12.

Figure 1B:
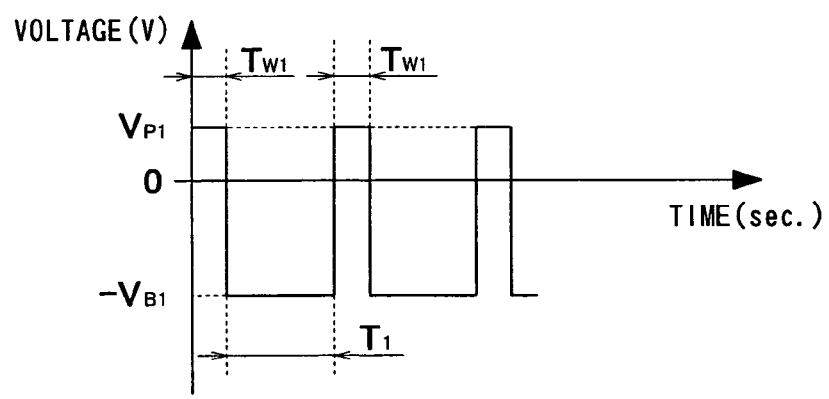
FIG. 1B is a diagram showing an example of a bias voltage according to the present invention.

The following description is directed to the bias voltage outputted from the bias power supply unit 12. FIG. 1B shows an example of a bias voltage waveform. In FIG. 1B the horizontal axis corresponds to time (sec.) while the vertical axis corresponds to the magnitude of a voltage value (V). The upper side above the horizontal axis is a positive voltage zone, while the lower side below the horizontal axis is a negative voltage zone.

As shown in FIG. 1B, the bias voltage comprises positive bias portions assuming a constant positive voltage value ($V_{P1}$) and negative bias portions assuming a constant negative voltage value ($-V_{B1}$).

For duration $T_{W1}$ of one period ($T_{W1}+T_1$) a positive voltage in the form of a square wave pulse is outputted as the bias voltage as shown in FIG. 1B. For the other duration $T_1$ of one period ($T_{W1}+T_1$) a negative voltage is outputted as the bias voltage as shown in FIG. 1B.

With use of the film deposition system 10 described above a film can be deposited in the following manner. The evaporation source 3 is loaded with a film material comprising a halogen compound, and the substrate 5 is set on the substrate holder 2. In setting the substrate 5 on the substrate holder 2 the substrate 5 is placed so that its obverse side to be deposited with the film faces opposite to the evaporation source 3.

Subsequently, the power supply unit 8 is actuated to supply the radio frequency power into the chamber 1 through the substrate holder 2 and apply the bias voltage to the substrate holder 2, while the halogen compound is evaporated by the evaporation source 3.

By so doing, plasma is generated in the vacuum chamber 1, and the halogen compound evaporated from the evaporation source 3 is ionized (excited) by plasma thus generated. Resulting ions of the halogen compound are caused to impinge upon and adhere to the substrate 5, thus depositing the film.

In the process of depositing a film on the substrate 5 with the film deposition system 10, if the radio frequency power is supplied to the chamber 1 in the presence of plasma therein, a negative potential is provided the obverse side of the substrate 5 due to what is called a "self-bias".

Such a negative potential due to the self-bias and the negative bias caused by the bias voltage make it possible to accelerate the movement of positively-charged ions of the halogen compound toward the substrate 5. In this way the negative bias of the bias voltage enables further acceleration of the movement of such halogen compound ions, thus rendering denser the structure of the film to be deposited on the substrate.

Though the halogen element with weak chemical bond is easily dissociated from the ionized halogen compound in the film-depositing process performed by the film deposition system 10, the present invention allows the halogen element once dissociated to be incorporated into the film being deposited on the substrate 5. Specifically, the positive bias of the bias voltage allows negatively-charged ions of the halogen element to be incorporated into the film being deposited on the substrate 5.

Thus, the film to be deposited on the substrate 5 can be prevented from becoming deficient in the halogen element and, hence, it is possible to avoid any degradation in the function of the film which would otherwise occur due to the deficiency of the halogen element.

Here, a brief description is made of the self-bias. The high pass filter 15 has a blocking capacitor (not shown) serially connected to the radio frequency power supply unit 11. This blocking capacitor permits the radio frequency component of a current to pass therethrough but blocks the DC component of the current. Accordingly, when the radio frequency power is supplied into the vacuum chamber 1, electric charge introduced into the substrate holder 2 from plasma generated by the radio frequency power is built up in the blocking capacitor. Since electrons present in plasma travel toward the substrate holder 2 at a higher speed than do ions present in plasma, an offset voltage, which is determined by the capacity of the blocking capacitor and the amount of charge in the capacitor, is generated between the opposite ends of the blocking capacitor and is applied to the substrate holder 2. A voltage generated at an electrode (the substrate holder 2 in this case) in contact with plasma according to this mechanism is referred to as a "self-bias". Such a self-bias is substantially a constant voltage (substantially a DC voltage) and is generated so that the substrate holder 2 assumes a negative potential.

Figure 17:
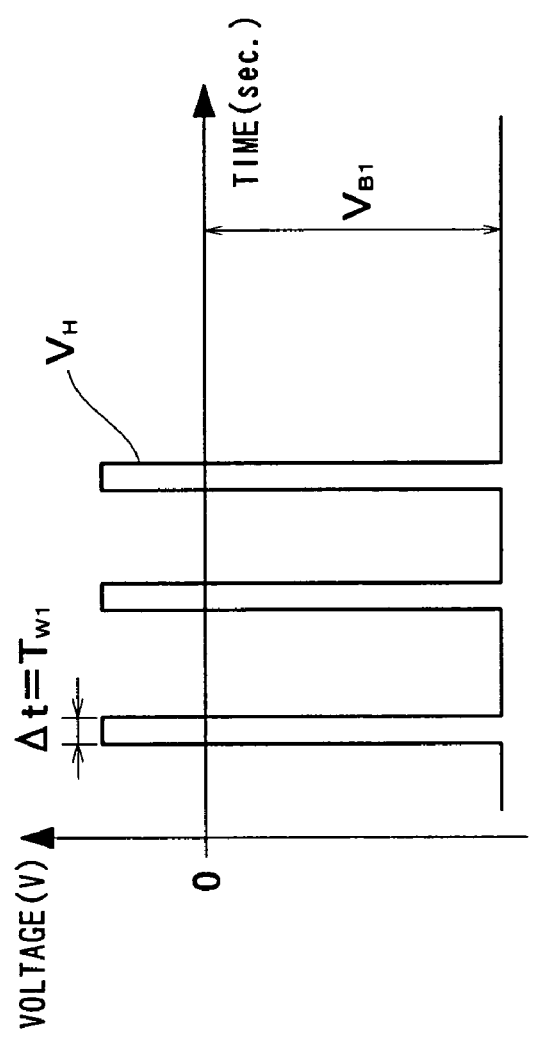
FIG. 17 is a graph showing variations in the electric potential of the substrate holder shown in FIG. 1.

The relationship between the self-bias and the bias voltage outputted from the bias power supply unit 12 is described below. The blocking capacitor and the bias power supply 12 are connected in parallel with each other with respect to the substrate holder 2. In such a case one of the self-bias and the bias voltage outputted from the bias power supply unit 12, whichever the superior, is predominantly applied to the substrate holder 2. In the subject mode of practicing the present invention the bias voltage outputted from the bias power supply unit 12 is superior to the self-bias and hence is predominantly applied to the substrate holder 2. Thus, as shown in FIG. 17, potential $V_H$ at the substrate holder 2 substantially conforms with the bias voltage (refer to FIG. 1B) generated by the bias power supply unit 12 and varies as does the bias voltage.

Maximum value $V_{P1}$ of the bias voltage generated by the bias power supply unit 12 is set higher than the voltage value (negative) of a self-bias that would be generated if the bias power supply unit 12 is absent. By so doing it is possible to suppress an electrical repulsion caused by the self-bias against negatively-charged ions of the halogen element thereby to facilitate incorporation of such halogen element ions into the film being deposited on the substrate 5. Assuming that the absolute value of the self-bias that would be generated if the bias power supply unit 12 is absent is $V_{dc}$, the maximum value $V_{P1}$ of the bias voltage preferably within the range of from $+0.5V_{dc}$ to $-0.5V_{dc}$. The absolute value $V_{dc}$ of the self-bias is about 200 V to about 300 V under typical film-forming conditions. What should be noted here is that the maximum value $V_{P1}$ of the bias voltage need not necessarily assume a positive value as shown in FIG. 1B and hence may assume a negative value. Of course, it is desirable that the maximum value $V_{P1}$ of the bias voltage be as high as possible within the aforementioned range. This is because such a high maximum value allows ions of the halogen element to be incorporated into the film being deposited on the substrate 5 easily. However, a maximum value $V_{P1}$ more than the upper limit of the aforementioned range is not preferable because discharge within the vacuum chamber 1 becomes unstable. The width $\Delta t$ of a positive-direction pulse of the bias voltage is preferably 10 µs or less. If it is more than 10 µs, discharge within the chamber 1 becomes unstable. With the film deposition method 10 shown in FIG. 1A the frequency of positive-direction pulses of the bias voltage is preferably within the range of from 100 kHz to 4×13.56 MHz. As will be described later, when the frequency of positive-direction pulses is 100 kHz or more, the effect of superposition of positive-direction pulses becomes noticeable, while if it is more than 4×13.56 MHz, discharge within vacuum the chamber 1 of the film deposition system 10 employing the radio frequency power supply unit 12 as shown in FIG. 1A becomes unstable.

Figure 2:
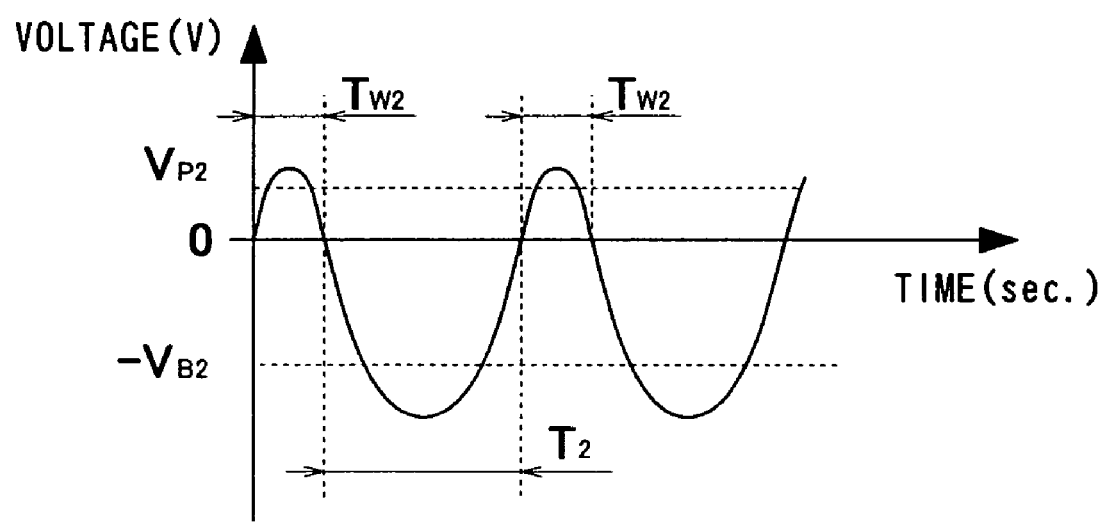
FIG. 2 is a diagram showing another example of the bias voltage according to the present invention.

Another example of the bias voltage is described below with reference to FIG. 2. FIG. 2 shows another waveform example of the bias voltage. The bias voltage shown in FIG. 2 has a gently curved waveform as a whole and comprises sinusoidal-wave negative bias portions assuming a negative voltage value ($-V_{B2}$) and sinusoidal-wave positive bias portions assuming a positive voltage value ($VP_2$).

As shown in FIG. 2, a positive voltage is outputted as the bias voltage for the duration $T_{W2}$ of one period ($T_{W2}+T_2$), while a negative voltage is outputted for the other duration $T_2$. The bias voltage of the waveform shown in FIG. 2 can be obtained by adding a DC voltage assuming a constant negative voltage value to an AC voltage.

The positive bias portions of the bias voltage having the waveform shown in FIG. 2 have a mean voltage value of a magnitude set larger than at least the absolute value of a negative potential at the substrate 5 caused by the aforementioned self-bias. By so setting it is possible to suppress electrical repulsion caused by the self-bias against negatively-charged ions of the halogen element thereby to facilitate incorporation of such halogen element ions into the film being deposited on the substrate 5.

It is desirable that the mean value of the magnitudes of positive bias portions be larger than the absolute voltage value of a negative potential caused by the aforementioned self-bias. If so, it is possible to provide a positive potential at the substrate 5 thereby to cause halogen element ions to be incorporated into the film being deposited on the substrate 5 more easily.

Next, another example of the power supply unit that can be used in the aforementioned film deposition system 10 will be described with reference to FIGS. 3A to 3A. A bias power supply unit 22 shown in FIG. 3A comprises a DC power supply 24 capable of outputting a constant negative DC voltage for providing a negative bias, and a pulse power supply 23 capable of outputting a constant positive pulse voltage for providing a positive bias.

The power outputted from the DC power supply 24 and the power outputted from the pulse power supply 23 form a bias voltage, which in turn is outputted to the substrate holder 2 side through a first low pass filter 21.

The first low pass filter 21 permits the bias voltage outputted from the DC power supply 24 and the pulse power supply 23 to pass therethrough toward the substrate holder 2 side while blocking the inputting of the power outputted from the radio frequency power unit 11 to the bias power supply unit 22 side.

Figure 3A:
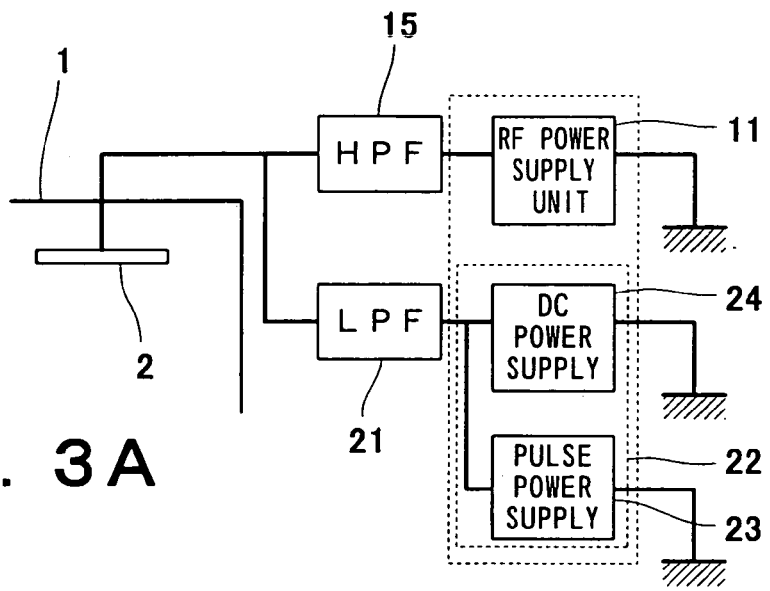
FIGS. 3A to 3C are views showing other examples of the configuration of a bias power supply unit according to the present invention.

In the bias power supply unit 22 configured as shown in FIG. 3A the DC power supply 24 for providing a negative bias and the pulse power supply 23 for providing a positive bias are independent of each other and, hence, it is possible to adjust the negative bias and the positive bias separately with ease.

Figure 3B:
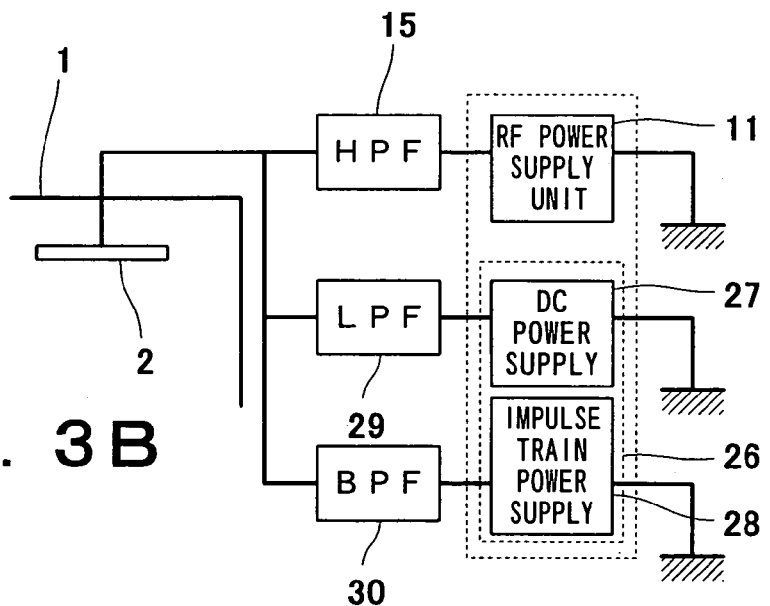

FIG. 3B shows yet another example of the bias power supply unit. Bias power supply unit 26 shown in FIG. 3B comprises a DC power supply 27 capable of outputting a constant negative DC voltage for providing a negative bias, and an impulse train power supply 28 for providing a positive bias. The DC power supply 27 outputs a power to the substrate holder 2 side through a second low pass filter 29, while the impulse train power supply 28 outputs a power to the substrate holder 2 side through a band pass filter 30. These powers thus outputted form a bias voltage to be applied to the substrate holder 2.

The second low pass filter 29, which is located between the DC power supply 27 and the substrate holder 2, permits the power outputted from the DC power supply 27 to pass therethrough toward the substrate holder 2 side while blocking the inputting of respective powers outputted from the radio frequency power unit 11 and from the impulse train power supply 28 to the DC power supply 27 side.

The band pass filter 30, which is located between the impulse train power supply 28 and the substrate holder 2, permits the power outputted from the impulse train power supply 28 to pass therethrough toward the substrate holder 2 side while blocking the inputting of respective powers outputted from the radio frequency power unit 11 and from the DC power supply 27 to the impulse train power supply 28 side.

In the bias power supply unit 26 shown in FIG. 3B the DC power supply 27 for providing a negative bias and the impulse train power supply 28 for providing a positive bias are independent of each other, and similarly the filters 29 and 30 associated with respective powers outputted from these power supplys to the substrate holder 2 side are independent of each other. Hence, it is possible to adjust the bias voltage more easily.

Figure 3C:
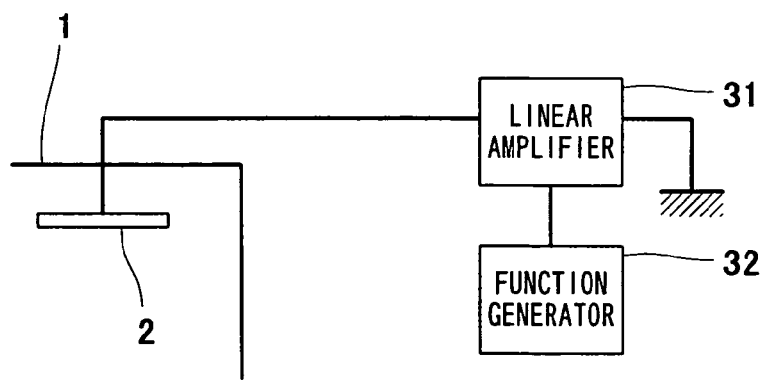

FIG. 3C shows yet another example of the power supply unit. According to this example shown in FIG. 3C, the power supply unit comprises a linear amplifier 31 and a function generator 32. The function generator 32 generates a waveform composed of the radio frequency waveform of the radio frequency power, the waveform of negative bias portions of the bias voltage and the waveform of positive bias portions of the bias voltage and causes the linear amplifier 31 to amplify the waveform thus composed and output the waveform amplified as a desired output to the substrate holder 2 side.

The power supply unit configured as shown in FIG. 3C does not require the provision of a filter and hence dispenses with adjustment of such a filter. Further, it is possible to unify controls over radio frequency outputs and negative and positive bias outputs of the bias voltage thereby to adjust the power balance easily.

It should be noted that in the case of the bias power supply unit 22 or 26 shown in FIG. 3A or 3B which is adapted to output a negative bias portion and a positive bias portion independently of each other, the outputs of the DC power supply 24 or 27 and pulse power supply 23 or impulse train power supply 28 are adjusted relative to each other so that the bias voltage composed of these negative and positive bias outputs can provide a negative bias of a predetermined voltage value and a positive bias of a predetermined voltage value.

Though the foregoing description has been directed to an example of the bias voltage that provides both a positive bias and a negative bias, the negative bias need not necessarily be outputted and it is possible to exert an electrical attractive force upon ions of the halogen compound thereby to accelerate the movement of such ions toward the substrate 5 without the need of outputting the negative bias. Specifically, since the aforementioned self-bias caused by the supply of the radio frequency power to plasma assumes a negative potential, the self-bias is capable of exerting an attractive force upon ions of the halogen compound.

In practicing the present invention with the film deposition system 10 described above the film deposition system 10 may be configured so that it is controlled through a controller not shown.

This controller is capable of exercising controls over the film deposition system 10 so that: the aforementioned radio frequency power supply unit 11 operates to output a radio frequency power having a desired power value and a desired frequency; the aforementioned bias power supply unit 12, 22 or 26 operates to output desired negative bias and positive bias; and the aforementioned function generator 32 and linear amplifier 31 perform desired actions.

The controller may be configured to actuate the evacuation means such as a vacuum pump and the gas supply means so as to provide a desired vacuum atmosphere in the chamber 1.

EXAMPLE

The present invention can use various halogen compounds as film materials for films that can be deposited according to the present invention. In the subject example the present invention is applied to magnesium fluoride as a most preferred application of the present invention.

First, the behavior of fluorine ions in ion plating is described below.

Figure 7:
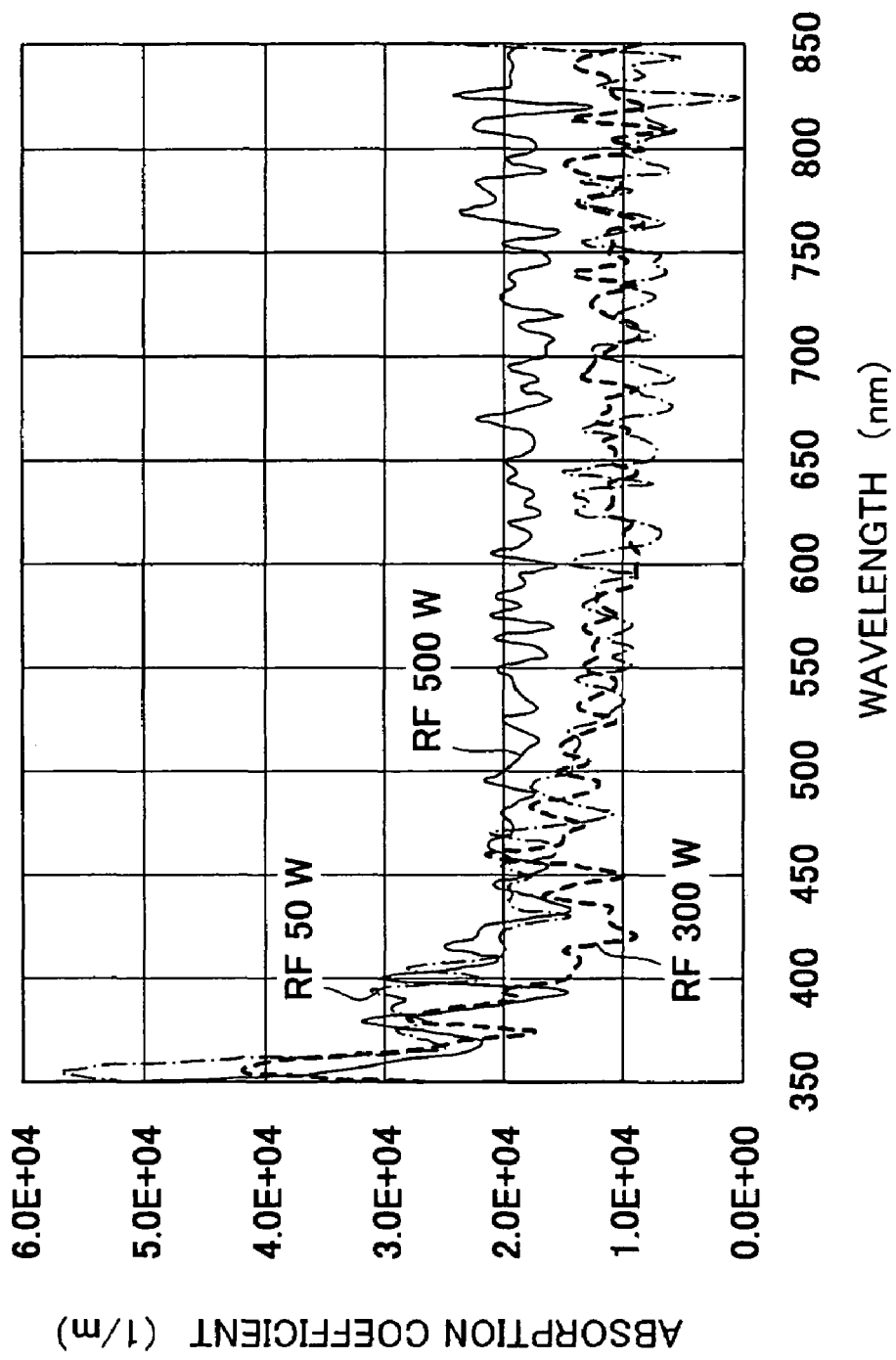
FIG. 7 is a graph showing the influence of a radio frequency power upon the absorption coefficient of a magnesium fluoride thin film.

FIG. 7 is a graph showing the influence of a radio frequency power upon the absorption coefficient of a magnesium fluoride thin film. In FIG. 7 the horizontal axis and the vertical axis represent a wavelength and an absorption coefficient, respectively. The radio frequency power was varied stepwise to assume three levels of 50 W, 300 W and 500 W as a parameter. As apparent from FIG. 7, the absorption coefficient of a magnesium fluoride thin film deposited on a substrate in the visible light region increases as the radio frequency power supplied to a vacuum chamber becomes higher.

Figure 8:
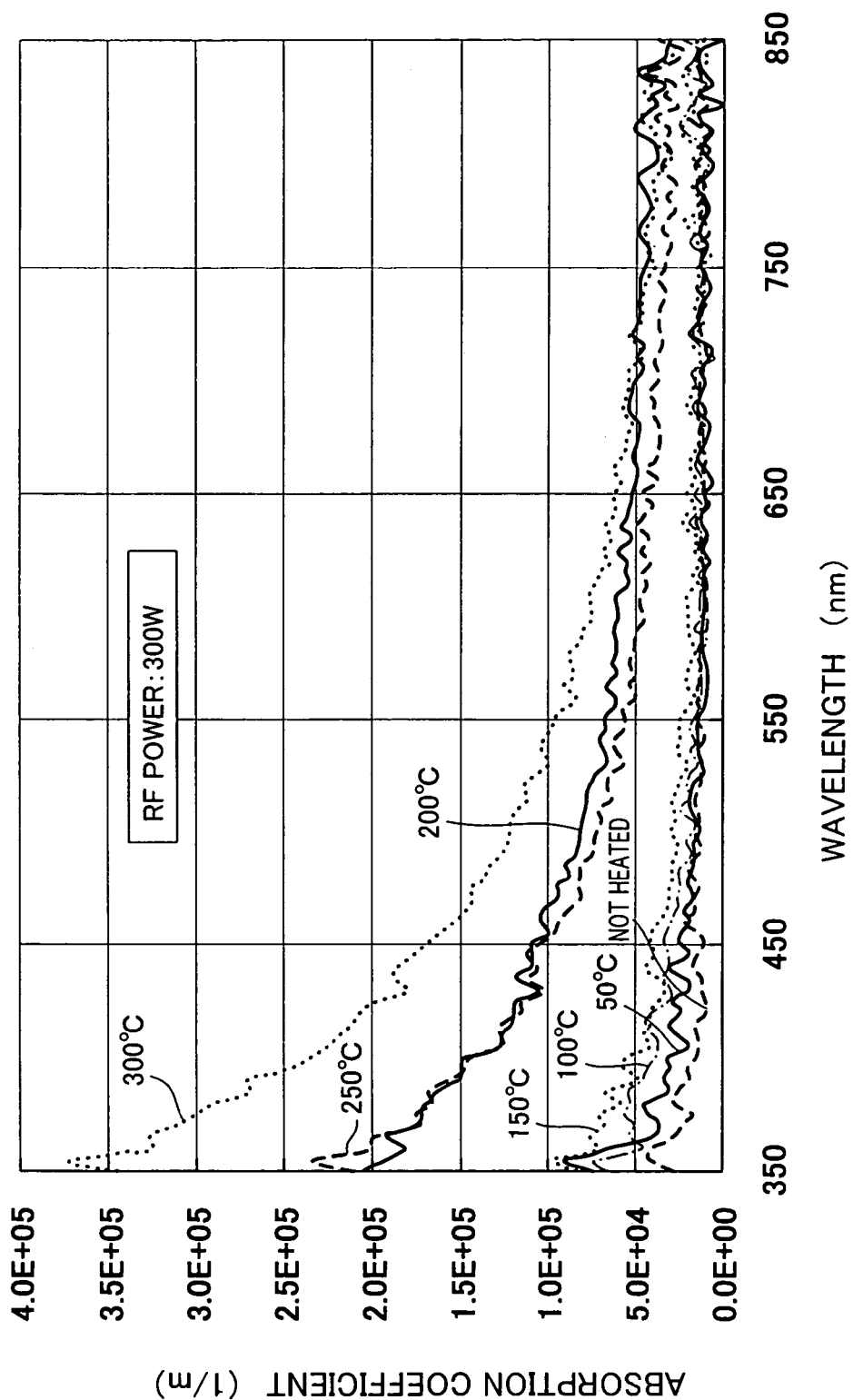
FIG. 8 is a graph showing the influence of a substrate temperature upon the absorption coefficient of a magnesium fluoride thin film.

FIG. 8 is a graph showing the influence of a substrate temperature upon the absorption coefficient of a magnesium fluoride thin film. In FIG. 8 the horizontal axis and the vertical axis represent a wavelength and an absorption coefficient, respectively. The substrate temperature was varied stepwise to assume seven levels of not heated, 50° C., 100° C., 150° C., 200° C., 250° C., 300° C. as a parameter. The radio frequency power was set to 300 W. As apparent from FIG. 8, the absorption coefficient of a magnesium fluoride thin film deposited on a substrate in the visible light region increases as the substrate temperature rises.

Figure 9A:
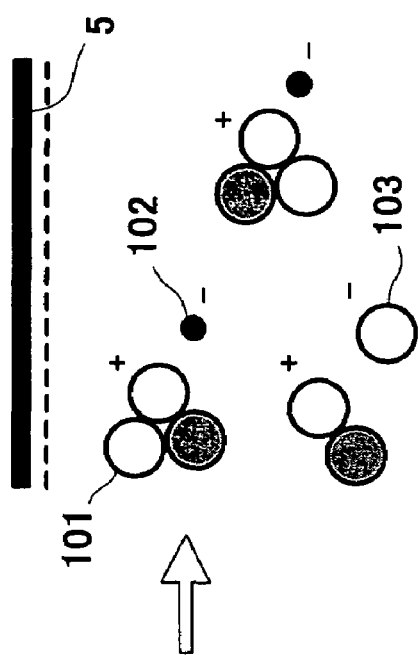
FIG. 9A is a schematic view illustrating obstruction to impingement of fluorine ions upon a substrate surface.
Figure 9A:
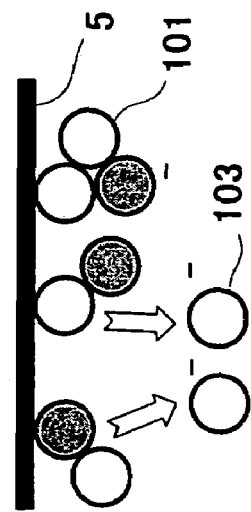
Figure 9B:
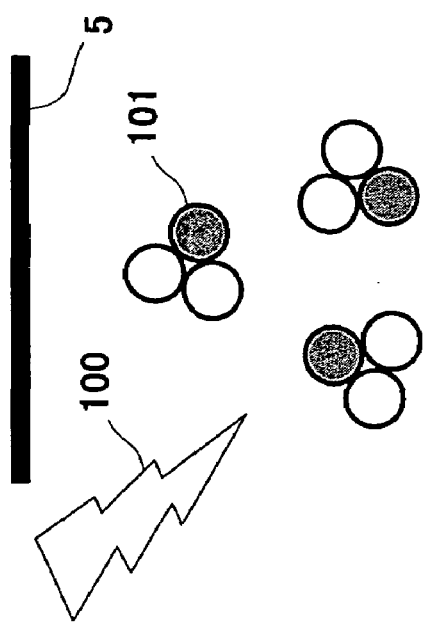
FIG. 9B is a schematic view illustrating elimination of fluorine ions from a substrate surface.
Figure 9B:
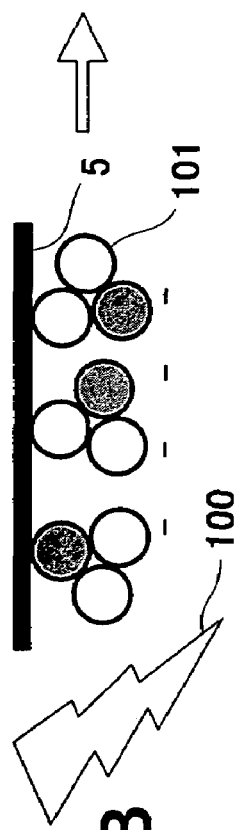

FIGS. 9A and 9B are schematic views illustrating obstruction to impingement of fluorine ions upon a substrate surface and elimination of fluorine ions from a substrate surface; that is, FIG. 9A illustrates the obstruction to impingement, while FIG. 9B illustrates the elimination.

The reason that the absorption coefficient of a magnesium fluoride thin film deposited on a substrate increases as the radio frequency power becomes higher, is considered as follows. As shown in FIG. 9A, the surface of the substrate 5 was negatively charged due to a self-bias caused by a radio frequency voltage. On the other hand, magnesium fluoride 101 evaporated from the evaporation source and passed through plasma 100 is positively charged. At this time fluorine ions 103 are dissociated from a portion of the magnesium fluoride 101. Since these fluorine ions 103 are negatively charged, their impingement upon the substrate 5 is obstructed. As a result, the magnesium fluoride thin film deposited on the substrate 5 is in a fluorine-deficient condition and hence has an increased absorption coefficient in the visible light region. The amount of fluorine ions 103 dissociated from the magnesium fluoride 101 is proportional to the radio frequency power. For this reason the absorption coefficient of the magnesium fluoride thin film increases as the radio frequency power becomes higher.

The reason that the absorption coefficient of a magnesium fluoride thin film increases as the substrate temperature rises, is considered as follows. As shown in FIG. 9B, since the substrate surface is negatively charged due to a self-bias caused by a radio frequency voltage, fluorine of magnesium fluoride 101 once deposited on the surface of the substrate 5 undergoes electrical repulsion. Since the bonding power of fluorine in magnesium fluoride 101 is weak, fluorine ions 103 are eliminated from a portion of magnesium fluoride 101. The number of eliminated fluorine ions 103 is proportional to the temperature of the substrate 5. For this reason the absorption coefficient of the magnesium fluoride thin film increases as the substrate temperature rises.

The actions and effects of the present invention are described in detail below.

FIGS. 10A and 10B are views illustrating actions of the present invention; specifically, FIG. 10A illustrates the action of incorporating dissociated fluorine ions, while FIG. 10B illustrates the action of preventing elimination of fluorine.

Since the bias voltage has a duration for which a positive bias is provided, fluorine ions 103 dissociated from magnesium fluoride 101 by plasma are incorporated into the film being deposited on the surface of the substrate 5 as shown in FIG. 10A. Further, since the bias voltage has a duration in which a positive bias is provided periodically, fluorine ions 103 are prevented from being eliminated from magnesium fluoride 101 deposited on the substrate surface. As a result, the absorption coefficient of the magnesium fluoride film to be deposited on the substrate 5 is prevented from increasing in the visible light region.

The effects of the present invention are described below.

Figure 11:
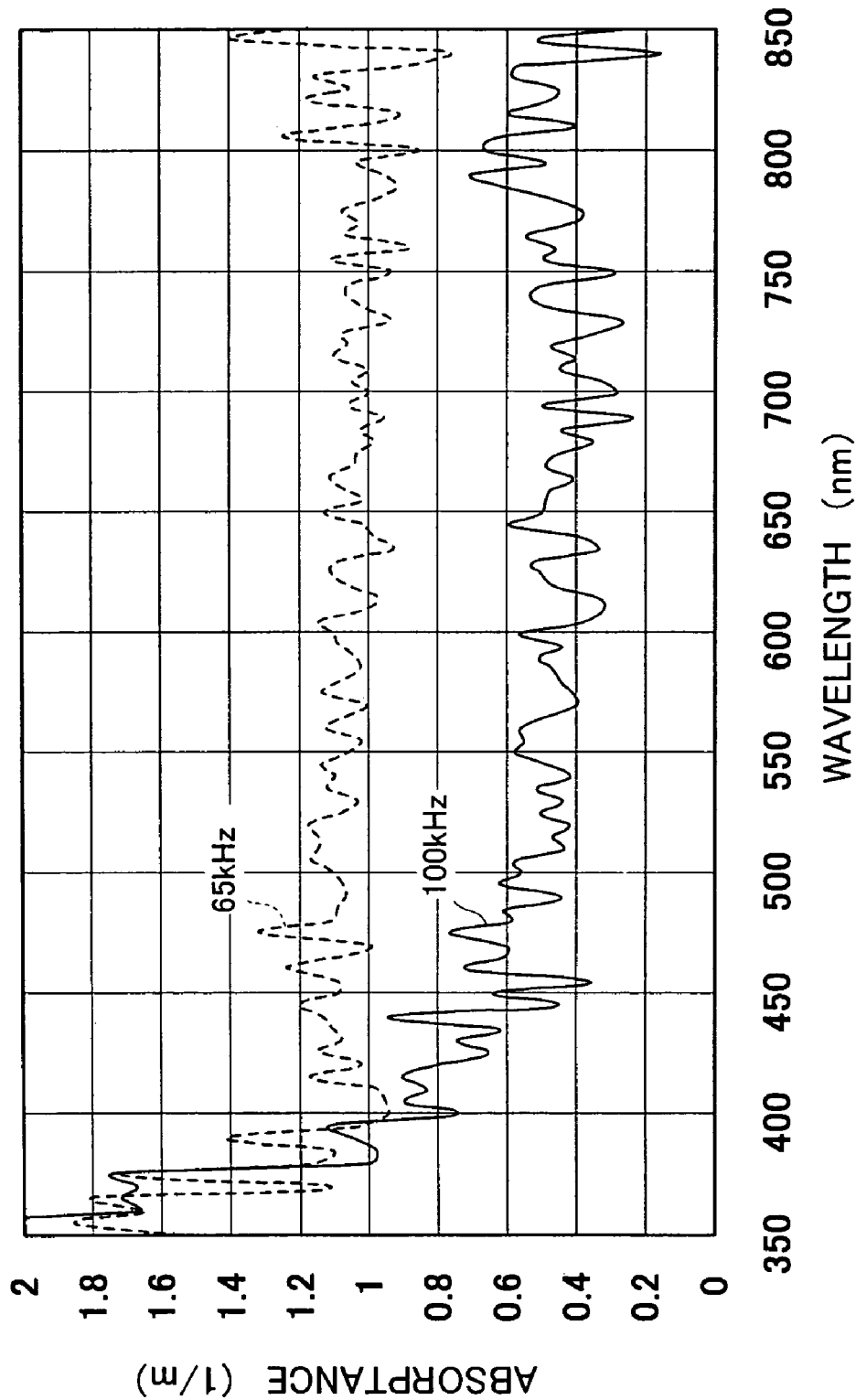
FIG. 11 is a graph showing the dependence of the absorptivity of a magnesium fluoride thin film upon the pulse frequency of a bias voltage.
Figure 12:
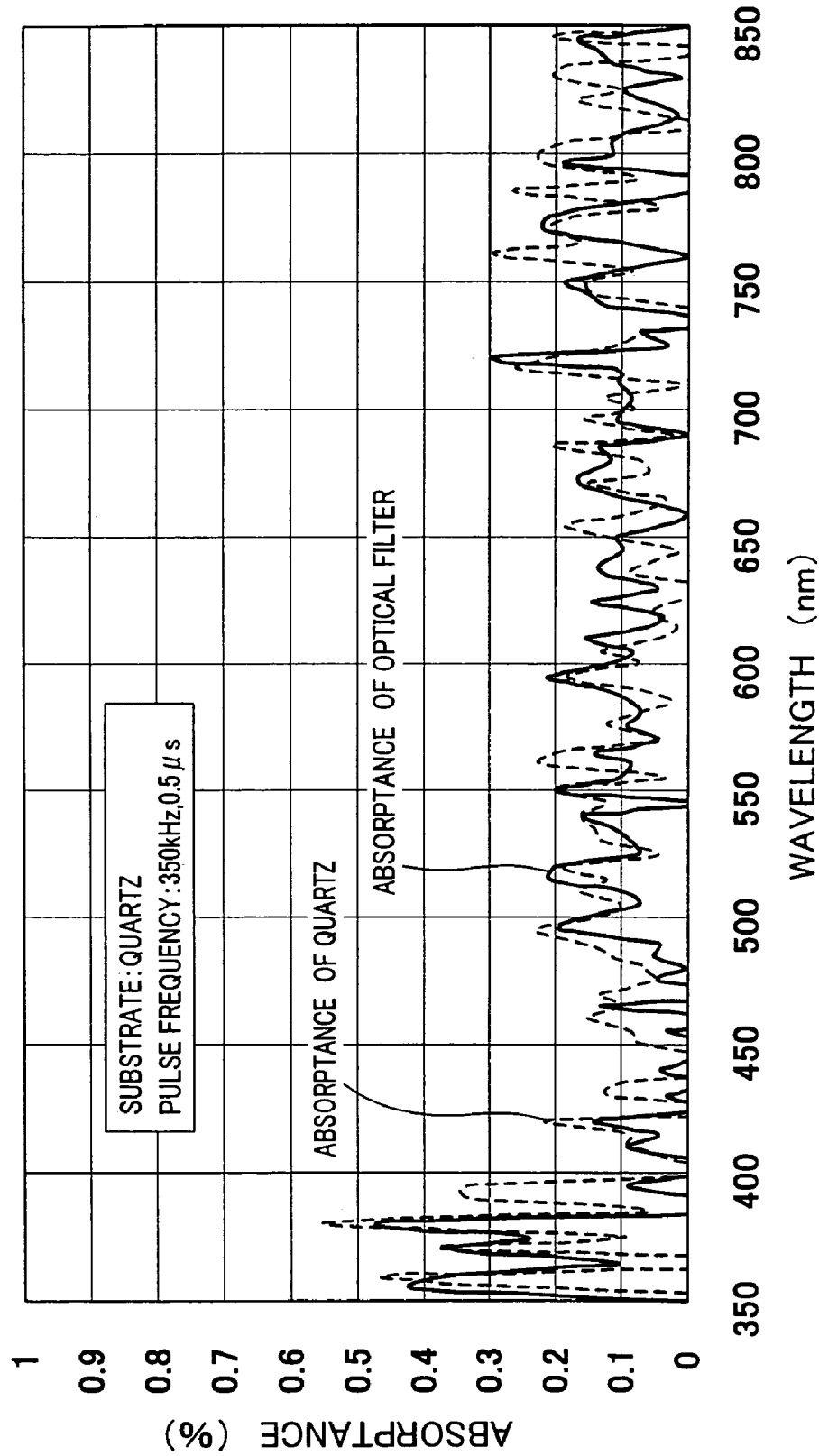
FIG. 12 is a graph showing the absorptivity of a magnesium fluoride thin film deposited on a quartz substrate within the visible light region.

FIG. 11 is a graph showing the dependence of the light absorptance of a magnesium fluoride thin film upon the pulse frequency of a bias voltage. In FIG. 11 the horizontal axis and the vertical axis represent a wavelength and a light absorptance, respectively. The pulse frequency of a bias voltage of the waveform shown in FIG. 1B was varied to assume two levels of 65 kHz and 100 kHz. As a result, the thin film deposited using the bias voltage having a pulse frequency of 100 kHz exhibited a considerably lowered absorptance as compared with the absorptance of the thin film deposited using the bias voltage having a pulse frequency of 65 kHz. Thus, the absorptance obtained with the pulse frequency of 100 kHz was satisfactory. Though not specifically described in the subject example, the absorptance obtained with the pulse frequency of 65 kHz made substantially no difference from that obtained without application of a positive bias. FIG. 12 to be specifically described later shows the case where the pulse frequency of a bias voltage was 350 kHz and a quartz (silica) substrate was used. Though the case where the pulse frequency is more than 350 kHz is not shown, it is theoretically preferred that the bias voltage have short positive bias durations with a shortest-possible cycle. Accordingly, a higher pulse frequency is more preferable. However, it is practically desirable that the pulse frequency be not higher than 2.45 GHz because too high a pulse frequency makes plasma discharge in the vacuum chamber unstable. If the pulse frequency is set to 2.45 GHz, it is desirable to use an ECR (electron cyclotron resonance) apparatus. A film deposition system employing such an ECR apparatus will be described later.

FIG. 12 is a graph showing the light absorptance of a magnesium fluoride thin film deposited on a quartz substrate within the visible light region. In this case the magnesium fluoride thin film exhibited a lower absorptance than in the case of FIG. 11 where the magnesium fluoride film was deposited on a glass substrate by virtue of a combined effect of the use of the quartz substrate and the setting of the pulse frequency of a bias voltage to 350 kHz. For reference, the absorptance of quartz is also shown in FIG. 12.

Figures 13A, 13B:
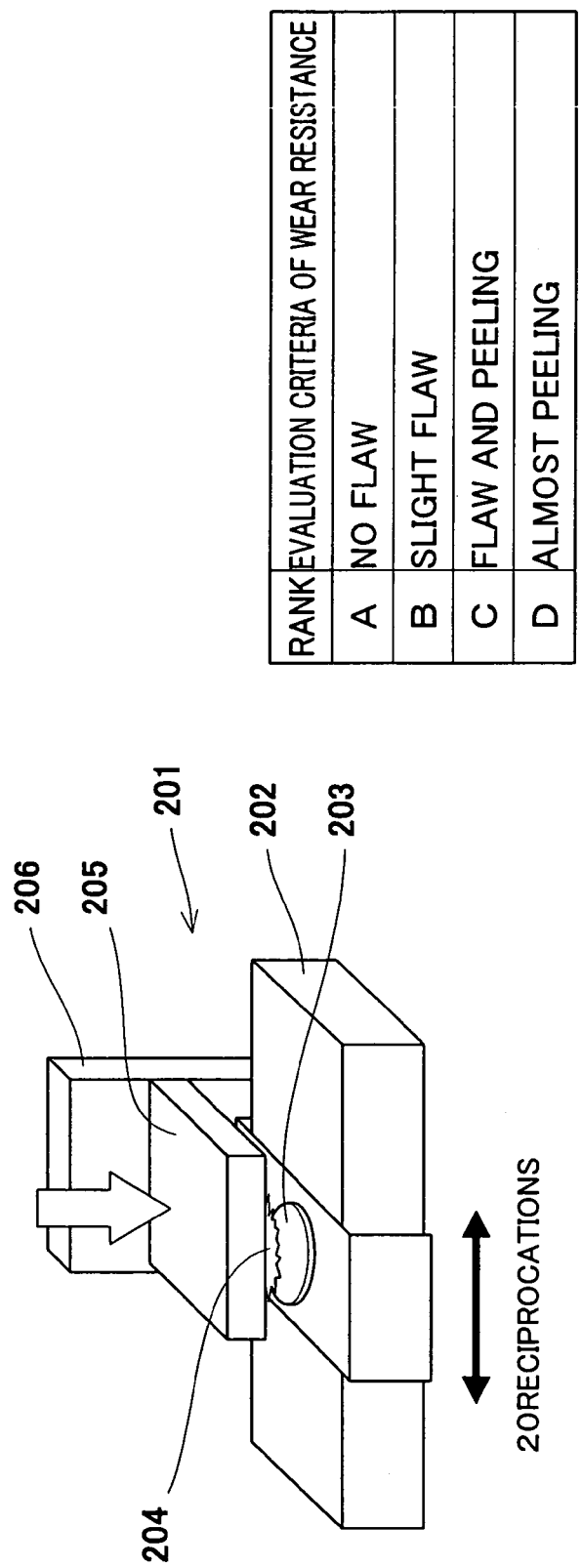
FIG. 13A is a perspective view schematically showing the overview of a wear-resistance tester for illustrating a wear-resistance test.
FIG. 13B is a table showing wear-resistance evaluation criteria for illustrating the wear-resistance test.

FIGS. 13A and 13B are drawings for illustrating a wear-resistance test; specifically, FIG. 13A is a perspective view schematically showing the overview of a wear-resistance tester, while FIG. 13B is a table showing wear-resistance evaluation criteria.

As shown in FIG. 13A wear-resistance tester 201 used in this test comprises a reciprocating movable base 202 for receiving a test sample (a substrate deposited with a thin film) 203 thereon, and a press element 205 having steel wool 204 on the underside thereof for pressing the test sample 203 at a predetermined load (700 g in this case). Reference numeral 206 denotes an arm holding the press element 205. The steel wool 204 used here was of #0000. The wear-resistance of each test sample was rated on the following four ranks A to D as shown in FIG. 13B: rank A indicating a film condition with no flaw, rank B indicating a film condition with slight flaw, rank C indicating a film condition with flaw and peeling, and rank D indicating a film condition almost peeled.

According to the results of rating with the wear resistance tester 20 and the wear-resistance evaluation criteria, the wear-resistance of a thin film deposited under application of a positive bias was rated higher by about one rank than that of a thin film deposited without application of a positive bias. The wear-resistance of a thin film deposited with the degree of vacuum optimized in the film-depositing process was rated higher by about one to about two ranks than that of a thin film deposited under usual conditions.

FIG. 14 is a table showing the crystal grain diameters of magnesium fluoride films. As seen from FIG. 14, the crystal grain diameter of a magnesium fluoride thin film deposited by evaporation at 300° C. is 12 to 20 nm. A magnesium fluoride thin film deposited by evaporation at a normal temperature (that is, the substrate was not heated) was not crystallized and, hence, determination of the crystal grain diameter thereof is impossible. In contrast, the crystal grain diameter of a magnesium fluoride thin film deposited using the film deposition system according to the subject example is 3 to 10 nm. From this fact it is found that the magnesium fluoride thin film according to the subject example has a crystal grain diameter that cannot be achieved by the prior art. Conceivably, the main reason therefor is that the magnesium fluoride thin film according to the subject example is deposited by ion plating at a relatively low temperature (about 100° C. or below).

Preferable gas species for use in the present invention are as follows. In the subject example the vacuum chamber 1 is charged with argon gas. Use of a fluorine-containing gas such as $CF_4$ or $SF_6$ is more advantageous because such a gas can replenish the film to be deposited on the substrate with fluorine.

The following description is directed to an application of the present invention to a multi layered film.

Figure 15B:
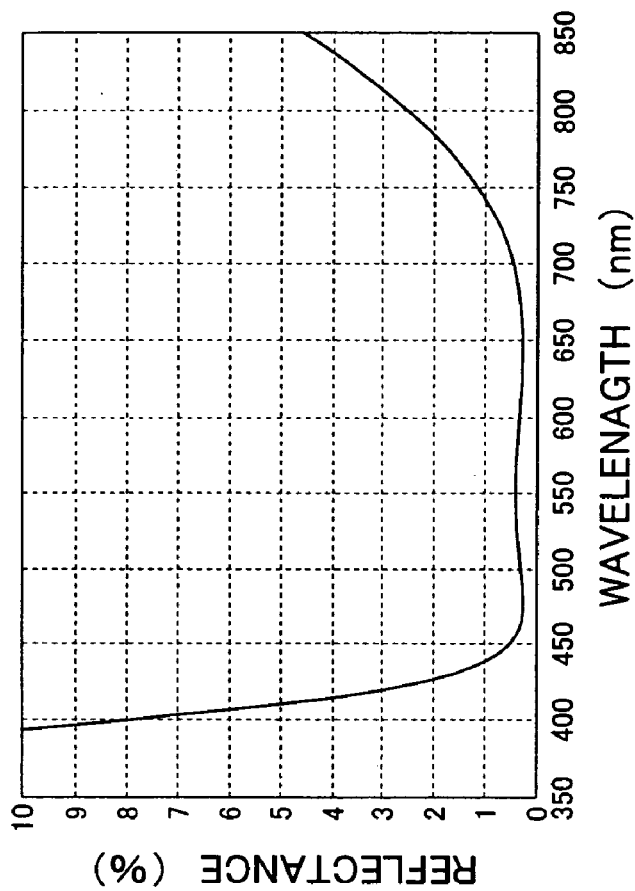
FIG. 15B is a graph showing the reflectivity of a multi-layered film formed on a substrate within the visible light region for illustrating an application of an embodiment according to a practicing the present invention to a multi layered film.
Figure 15A:
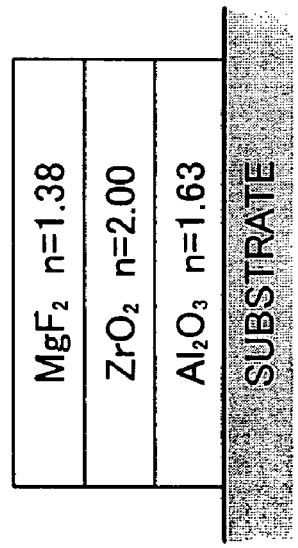
FIG. 15A is a view showing the structure of a multi layered film for illustrating an application of an embodiment according to a practicing the present invention to a multi layered film.

FIGS. 15A and 15B are drawings for illustrating an application of the subject example to a multi layered film; specifically, FIG. 15A is a view showing the structure of a multi layered film, while FIG. 15B is a graph showing the reflectivity of a multi layered film formed on a substrate within the visible light region. As shown in FIG. 15A, a multi layered film according to the subject example comprises an $Al_2O_3$ film (refractive index n=1.63), a $ZrO_3$ film (refractive index n=2.00) and an $MgF_2$ film (refractive index n=1.38) which are sequentially stacked on a substrate in that order. This multi layered film had a favorable reflectance as shown in FIG. 15B.

Figure 4:
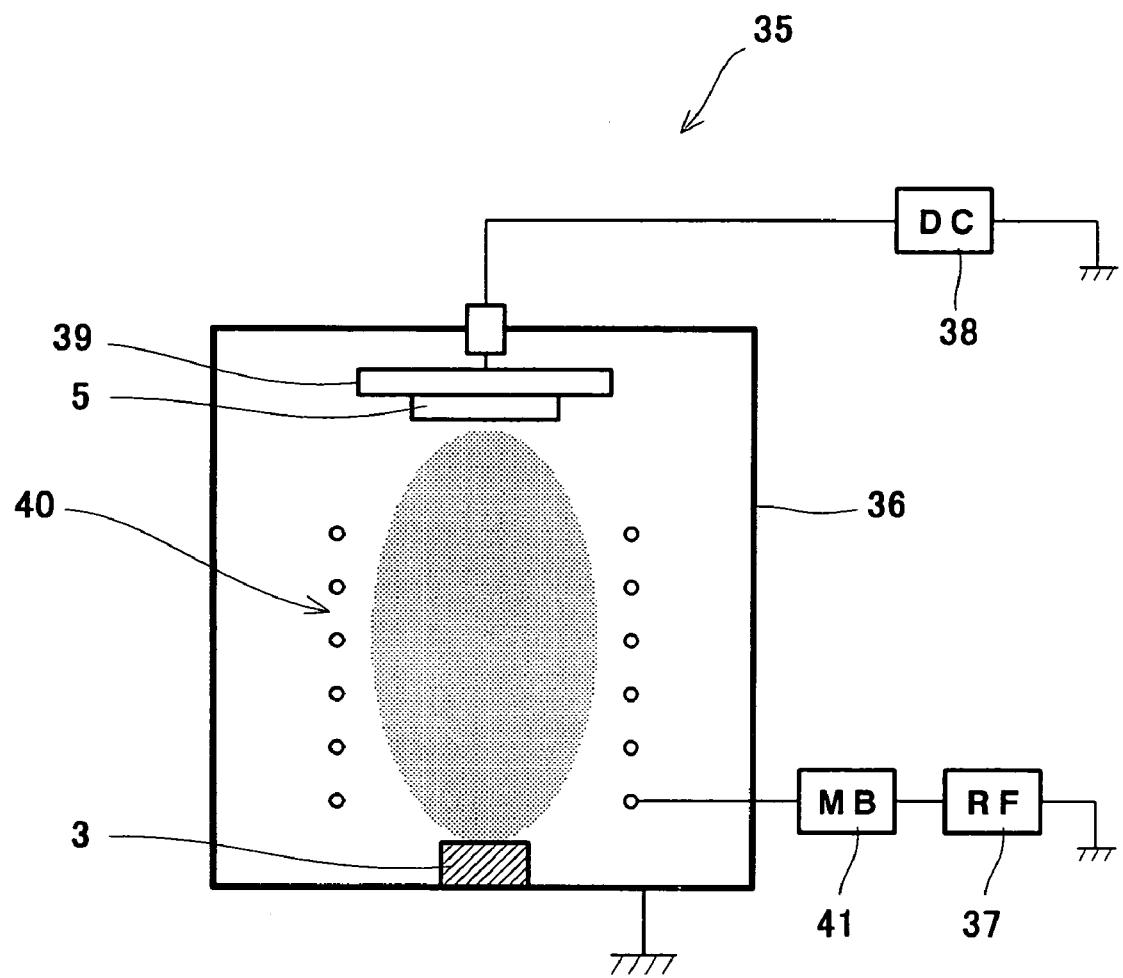
FIG. 4 is a schematic view showing the configuration of a vacuum deposition system capable of practicing the present invention.

Next, description will be made of another mode of practicing the present invention. FIG. 4 is a schematic overview of the configuration of film deposition system 35 capable of practicing the invention in another mode. The film deposition system 35 is configured to form films on the basis of ion plating as a film deposition method.

The film deposition system 35 includes a vacuum chamber 36, a radio frequency power supply (RF) 37 and a bias power supply unit (DC) 38.

In an upper portion of the inside of the vacuum chamber 36 is disposed a substrate holder 39 for holding a substrate 5 on its back surface opposite from its obverse side on which a film is to be deposited. In the film deposition system 35 shown in FIG. 4 the substrate holder 39 is configured so that it is capable of functioning also as a bias supply electrode for supplying a bias voltage into the vacuum chamber 36. The substrate holder 39 is formed of an electrically-conductive material so as to be applied with the bias voltage outputted from the bias power supply unit 38.

The bias power supply unit 38 is capable of outputting a DC voltage having a constant positive voltage value. Application of the bias voltage outputted from the bias power supply unit 38 to the substrate holder 39 allows negatively-charged ions of a halogen element to be incorporated into the film being deposited on the substrate 5 as will be described later.

In a lower portion of the inside of the chamber 36 is disposed an evaporation source 3 for holding a film material comprising a halogen compound and for evaporating it into the space defined in the chamber 36. The evaporation source 3 is of the same construction as that used in the film deposition system 10 described earlier.

Between the evaporation source 3 and the substrate 5 in the chamber 36 is disposed an ionization electrode 40 in the form of a coil. The coiled ionization electrode 40 is connected to the radio frequency power supply 37 and, hence, it is possible to supply a radio frequency power into the chamber 36 through the ionization electrode 40.

The radio frequency power supply 37 supplies a radio frequency power for ionizing the film material evaporated from the evaporation source 3 and passing through the inside of the ionization electrode 40 to generate plasma. The radio frequency power supply 37 has one output terminal connected to the ionization electrode 40 through a matching box 41 and other output terminal grounded.

The matching box 41 includes a well-known matching circuit comprising a capacitor and a coil. Adjustment of the matching box allows matching to be made between the impedance of the radio frequency power supply 37 side and that of the vacuum chamber 36 side.

The vacuum chamber 36 is provided with evacuation means such as a vacuum pump and gas supply means, which are not particularly shown, for providing a desired vacuum atmosphere therein so that the atmosphere within the vacuum chamber 36 can be adjusted to a desired vacuum atmosphere meeting film-depositing conditions established.

With use of the film deposition system 35 described above a film can be deposited in the following manner. The evaporation source 3 is loaded with a film material comprising a halogen compound, and the substrate 5 is set on the substrate holder 39.

Subsequently, the radio frequency power supply 37 is actuated to supply a radio frequency power into the chamber 36 through the ionization electrode 40, while the halogen compound is evaporated by the evaporation source 3. At the same time, the bias power supply unit 38 is actuated to apply a positive DC voltage to the substrate holder 39.

In this way, the evaporated halogen compound passing through the ionization electrode 40 can be ionized to generate plasma, and resulting ions of the halogen compound are allowed to impinge upon and deposit on the substrate 5 thereby depositing the film.

Though the halogen element with weak chemical bond in the ionized halogen compound, is easily dissociated from the ionized halogen compound in the film depositing process performed by the film deposition system 35, it is possible to incorporate the halogen element once dissociated into the film being deposited on the substrate 5. Specifically, application of the DC voltage outputted from the bias power supply unit 38 to the substrate holder 39 causes negatively-charged ions of the halogen element to be incorporated into the film being deposited on the substrate 5.

Figure 5:
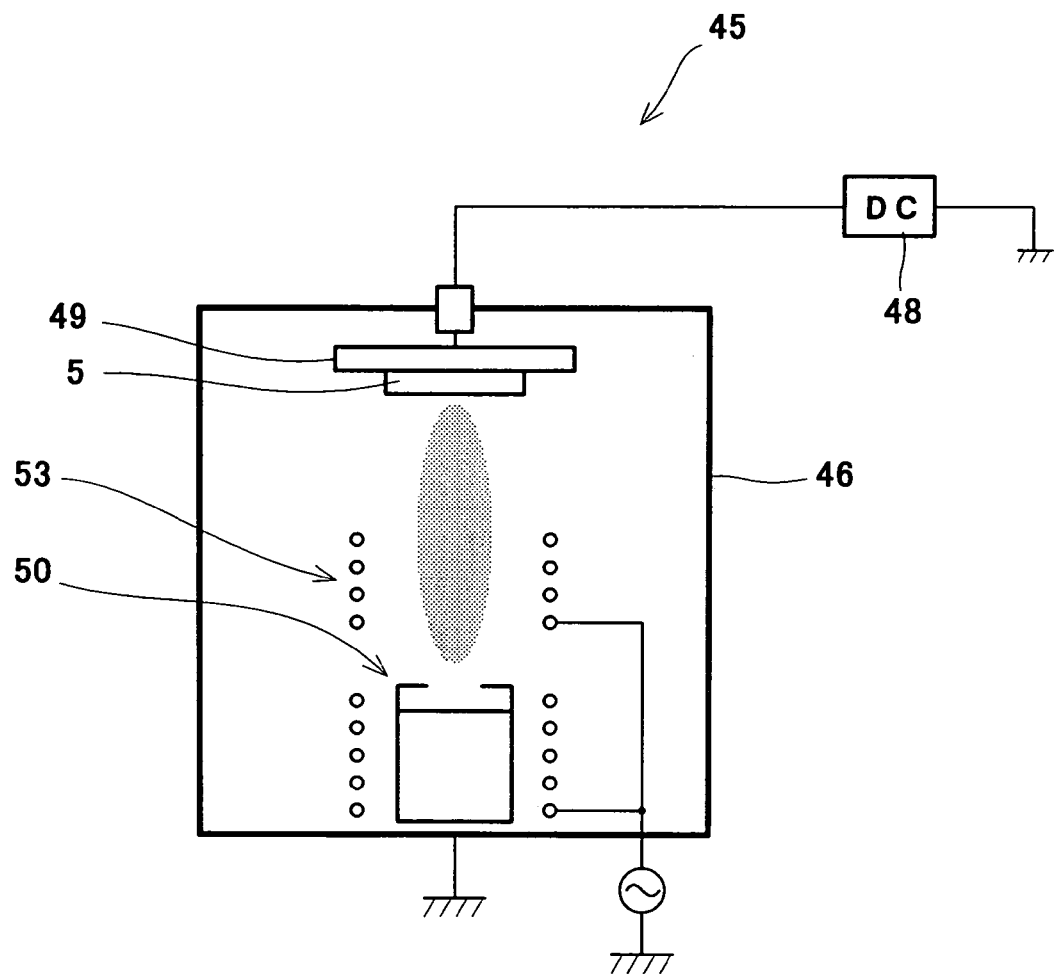
FIG. 5 is a schematic view showing the configuration of a vacuum deposition system capable of practicing the present invention.

Yet another mode of practicing the present invention is described below. FIG. 5 is a schematic overview of the configuration of film deposition system 45 capable of practicing the invention in yet another mode. The film deposition system 45 is configured to deposit films with use of a cluster ion beam.

The film deposition system 45 includes a vacuum chamber 46 and a bias power supply unit (DC) 48. In an upper portion of the inside of the vacuum chamber 46 is disposed a substrate holder 49 for holding a substrate 5 on its back surface opposite from its obverse side on which a film is to be deposited. In the film deposition system 45 shown in FIG. 5 the substrate holder 49 is configured so that it is capable of functioning also as a power supply electrode for supplying a bias voltage into the vacuum chamber 46. The substrate holder 49 is formed of an electrically-conductive material so as to be applied with the bias voltage outputted from the bias power supply unit 48.

The bias power supply unit 48 is capable of outputting a DC voltage having a constant positive voltage value. Application of the bias voltage outputted from the bias power supply unit 48 to the substrate holder 49 allows negatively-charged ions of a halogen element to be incorporated into the film being deposited on the substrate 5 as will be described later.

Cluster ion generating means is disposed in the chamber 46 so as to face opposite to the substrate 5. As will be described below, the cluster ion generating means comprises well-known means for generating a cluster of atoms or molecules and well-known means for ionizing the cluster.

The cluster ion generating means has a cluster evaporation source 50 located in a lower portion of the inside of the chamber 46 and a coiled ionization electrode 53. The cluster evaporation source 50 has a crucible for holding therein a film material comprising a halogen compound and a coiled bombard filament surrounding the outer periphery of the crucible for heating the film material in the crucible.

As the bombard filament heats the crucible, the film material upwardly evaporated from a nozzle provided at the upper end of the crucible becomes clustered and is shot toward the substrate 5. This cluster is formed by cooling due to adiabatic expansion in the process of shooting of the film material from the nozzle of the crucible into the vacuum atmosphere and comprises hundreds or thousands of atoms or molecules of the film material loosely bound with an intermolecular force or the like.

The cluster shot out of the cluster evaporation source 50 is ionized by a radio frequency power supplied thereto through the ionization electrode 53 during its passage through the inside of the ionization electrode 53, thus generating clustered ions.

The vacuum chamber 46 is provided with evacuation means such as a vacuum pump and gas supply means, which are not particularly shown, for providing a desired vacuum atmosphere therein so that the atmosphere within the vacuum chamber 46 can be adjusted to a desired vacuum atmosphere meeting film-depositing conditions established.

With use of the film deposition system 45 described above a film can be deposited in the following manner. The cluster evaporation source 50 is loaded with a film material comprising a halogen compound, and substrate 5 is set on the substrate holder 49.

Subsequently, a cluster is shot upwardly from the cluster evaporation source 50 and then passed through the inside of the ionization electrode 53 to generate clustered ions, which in turn are caused to impinge upon and deposit on the substrate 5 to deposit the film.

Though the halogen element with weak chemical bond in the cluster of the ionized halogen compound, is easily dissociated from the ionized halogen compound in the film depositing process performed by the film deposition system 45, it is possible to incorporate the halogen element once dissociated into the film being deposited on the substrate 5. Specifically, application of a DC voltage outputted from the bias power supply unit 48 to the substrate holder 49 causes negatively-charged ions of the halogen element to be incorporated into the film being deposited on the substrate 5.

The bias voltage outputted from the bias power supply unit 38 of the film deposition system 35 or from the bias power supply unit 48 of the film deposition system 45 described above may comprise a positive bias assuming a positive voltage and a negative bias assuming a negative bias.

That is, the bias voltage used in the film deposition system 35 or 45 may be the bias voltage comprising a positive bias assuming a positive voltage value in the form of pulses and a negative bias assuming a constant negative voltage value, which has been described as an example of the bias voltage for use in the film deposition system 10.

By application of such a bias voltage having a negative voltage portion to the substrate holder 39 or 49 in the film deposition system 35 or 45 it is possible to accelerate the movement of positively-charged halogen compound ions toward the substrate 5, thereby to deposit a film of a denser structure on the substrate 5.

Figure 6:
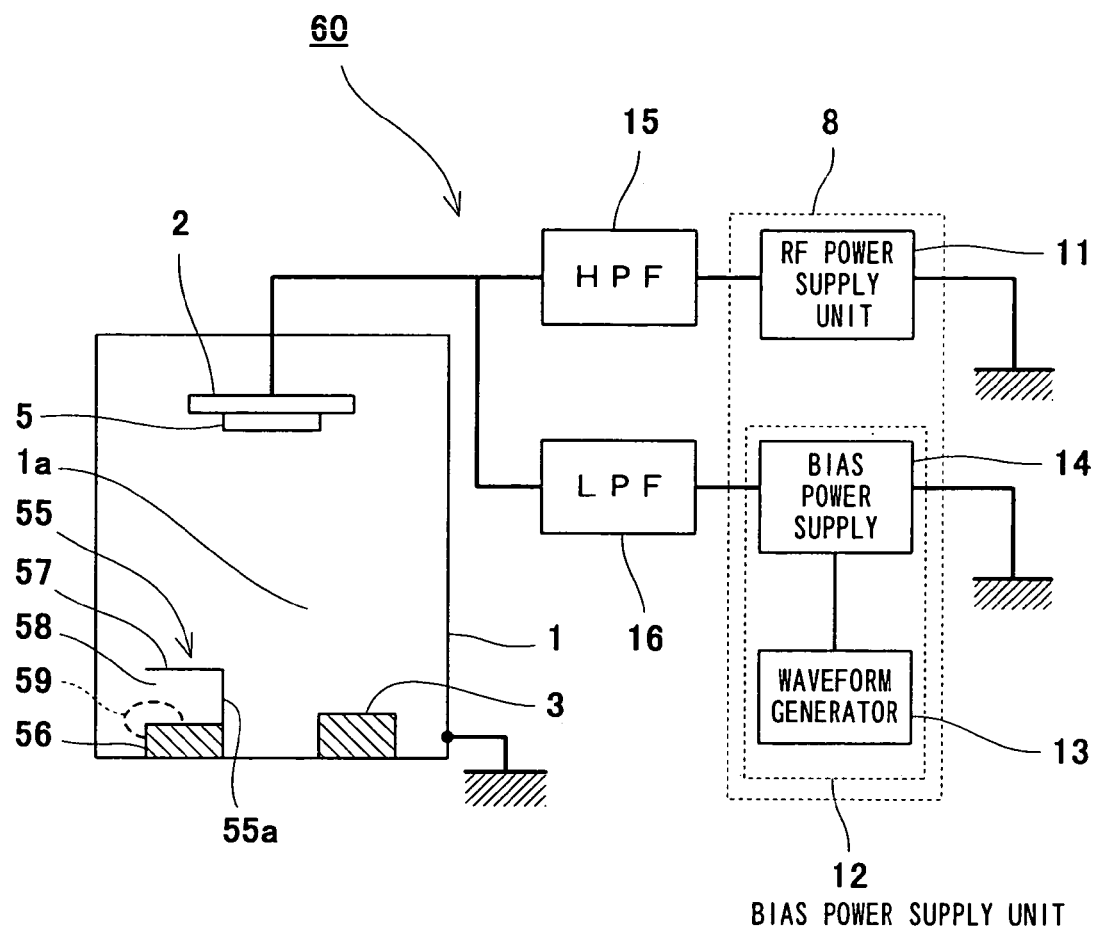
FIG. 6 is a schematic view showing the configuration of a vacuum deposition system capable of practicing the present invention.

Still another mode of practicing the present invention is described below. FIG. 6 is a schematic overview of the configuration of film deposition system 60 capable of practicing the invention in still another mode. The film deposition system 60 is configured to deposit films on the basis of ion plating.

The film deposition system 60 shown in FIG. 6 is of the same configuration as the film deposition system 10 shown in FIG. 1A except the provision of an electron beam evaporation source 55 in the vacuum chamber 1. Members other than the electron beam evaporation source 55 are the same as corresponding members used in the film deposition system 10. That is, the film deposition system 60 includes vacuum chamber 1, substrate 5, evaporation source 3, and substrate holder 2 serving also as a bias voltage supply electrode.

Reference numeral 8 denotes an electric power supply unit comprising radio frequency power supply unit 11 and bias power supply unit 12. The bias power supply unit 12 comprises waveform generator 13 and bias power supply 14. Reference numeral 15 denotes a high pass filter, while reference numeral 16 denotes a first low pass filter.

These members provided in the film deposition system 60 are each constructed similarly to the corresponding member of the film deposition system 10 to operate in the same manner as does the corresponding member.

The electron beam evaporation source 55 is a well-known electron beam evaporation source capable of evaporating a film material by heating with an electron beam. The electron beam evaporation source 55 includes a crucible 56 for holding a halogen compound as the film material. The crucible 56 is loaded with the same material as the halogen compound stored in the evaporation source 3.

The halogen compound in the crucible 56 is heated with electron beam 59 emitted from an electron gun not shown and is evaporated from an opening defined at an upper end of the crucible 56 into a space extending above the crucible 56.

The electron beam evaporation source 55 is provided with a shutter 57 spaced a predetermined distance above the upper end of the crucible 56 and disposed to cover the crucible 56. The shutter 57 can revolve about a support shaft 55*a* relative to the crucible 56 to switch its position between a closing position covering the crucible 56 from above and an open position retreated away from the position above the crucible 56.

When the shutter 57 is in the closing position, the shutter 57 obstructs the flow of the halogen compound evaporated from the crucible 56 and, hence, the evaporated halogen compound cannot directly impinge upon the substrate 5.

In the deposition of a film on the substrate 5 with use of the film deposition system 60 the halogen compound in the crucible 56 is heated, with the shutter 57 of the electron beam evaporation source 55 being in the closing position.

By so doing, it becomes possible to evaporate the halogen compound stored in the crucible 56 from the crucible 56. Since the shutter 57 obstructs the flow of the halogen compound thus evaporated, the evaporated halogen compound cannot directly advance toward the substrate 5 and hence is guided around sidewardly of space 58 defined between the crucible 56 and the shutter 57 into an open space 1*a* extending to the substrate 5 within the chamber 1.

Since ions of the halogen element are easily dissociated from the evaporated halogen compound, it is possible to guide such dissociated halogen ions to the substrate 5 by the positive voltage portion of the bias voltage outputted from the bias power supply unit 12.

With the film deposition system 60 thus configured to evaporate the halogen compound by means of the electron beam evaporation source 55 and obstruct the direct impingement of the halogen compound evaporated by the evaporation source 55 upon the substrate 5 by means of the shutter 57, ions of the halogen element dissociated from the evaporated halogen compound can be supplied to the substrate 5 preferentially.

Thus, it becomes possible to increase the amount of halogen ions to be supplied to the substrate 5 relative to the amount of the halogen compound evaporated in the chamber 1, thereby to avoid a relative decrease in the amount of the halogen contained in the film to be deposited on the substrate 5.

Since the evaporation source 55 evaporates the halogen compound using an electron beam, the evaporation source 55 is capable of evaporating the halogen compound in a more finely decomposed state, thus allowing ions of the halogen element to be dissociated more easily. Therefore, it becomes possible to supply such halogen ions to the substrate 5 more easily.

While the foregoing description has been directed to an example of the method of supplying halogen element ions to the substrate 5 by means of the electron beam evaporation source 55 with use of the film deposition system 60 comprising the electron beam evaporation source 55 in addition to the film deposition system 10 described with reference to FIG. 1A, it is possible to employ any other vacuum film deposition method which is capable of depositing films by ionizing a film material.

For example, it is possible to add the aforementioned electron beam evaporation source 55 to the film deposition system 35 described with reference to FIG. 4 or the film deposition system 45 described with reference to FIG. 5. In such a case also, ions of the halogen element can be supplied to the substrate 5 preferentially rather than the halogen compound evaporated by the evaporation source 55.

To be described below is still yet another mode of practicing the present invention.

Figure 16:
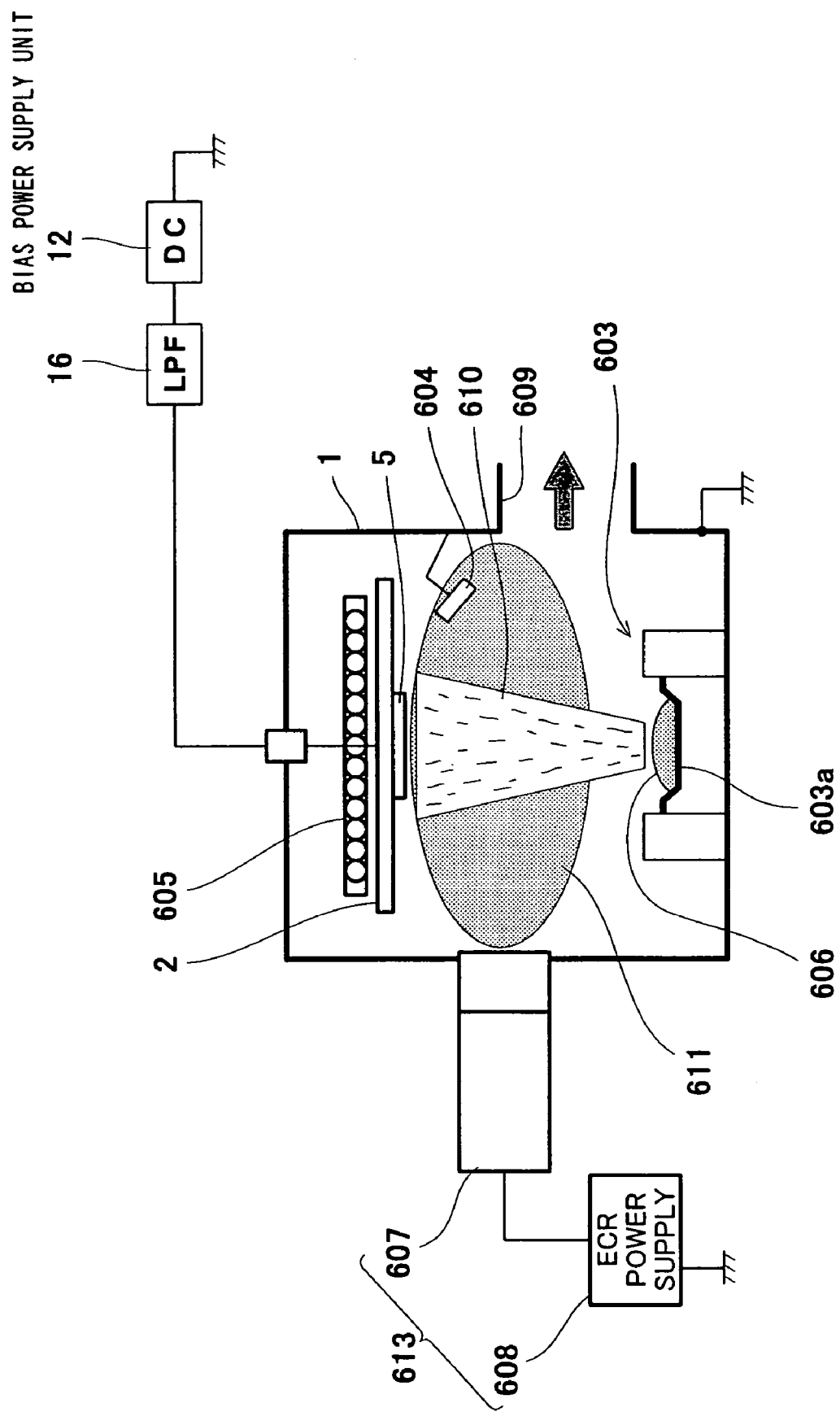
FIG. 16 is a schematic view showing an example of the configuration of a vacuum deposition system that is suitable for a bias voltage having a higher pulse frequency.

FIG. 16 is a schematic view showing the configuration of a vacuum film deposition system that is suitable for a bias voltage having a higher pulse frequency.

As shown in FIG. 16, the vacuum film deposition system of this configuration includes an ECR apparatus 613 instead of the combination of the radio frequency power supply unit and the high pass filter shown in FIG. 1A. The ECR apparatus 613 has an ECR cavity 607 open at a wall portion of the vacuum chamber 1 and an ECR power supply 608 and is configured to generate high-density plasma by directing a microwave of 2.45 GHz generated by the ECR power supply 608 into the ECR cavity 607 to cause electron cyclotron resonance under application of a magnetic field by a magnet not shown. Such plasma 611 is supplied into the vacuum chamber 1. Other features are the same as the corresponding ones of the film deposition system shown in FIG. 1A. This vacuum film deposition system employs evaporation source 603 of the resistive heating type adapted to evaporate a thin film material (magnesium fluoride) 606 placed on a boat 603*a* by resistive heating. Behind the substrate holder 2 is disposed a heater 605 for heating the substrate 5 from behind. Reference numeral 604 denotes a film thickness sensor, while reference numeral 609 denotes a gas outlet. Further, reference numeral 610 denotes the film material in an evaporated state.

The vacuum film deposition system thus configured supplies plasma 611 into the vacuum chamber 1 by means of the ECR apparatus 613 and hence prevents electric discharge from becoming unstable even if the pulse frequency of the bias voltage is made relatively high. It is possible to raise the pulse frequency up to a maximum of 2.45 GHz, which is equal to the frequency of the microwave supplied from the ECR power supply 608.

To be described below is yet still another mode of practicing the present invention. A vacuum film deposition system configured for use in this mode is similar to the vacuum film deposition system shown in FIG. 1A except that the bias power supply unit 12 and the low pass filter 16 are not provided and that the resistor and the capacitor used in a matching box not shown have respective predetermined values. This matching box comprises a fixed capacitor, a fixed resistor, a variable capacitor and the like. The inventor of the present invention has found that the following phenomenon occurs when the fixed capacitor and the fixed resistor have respective predetermined values.

Figure 18:
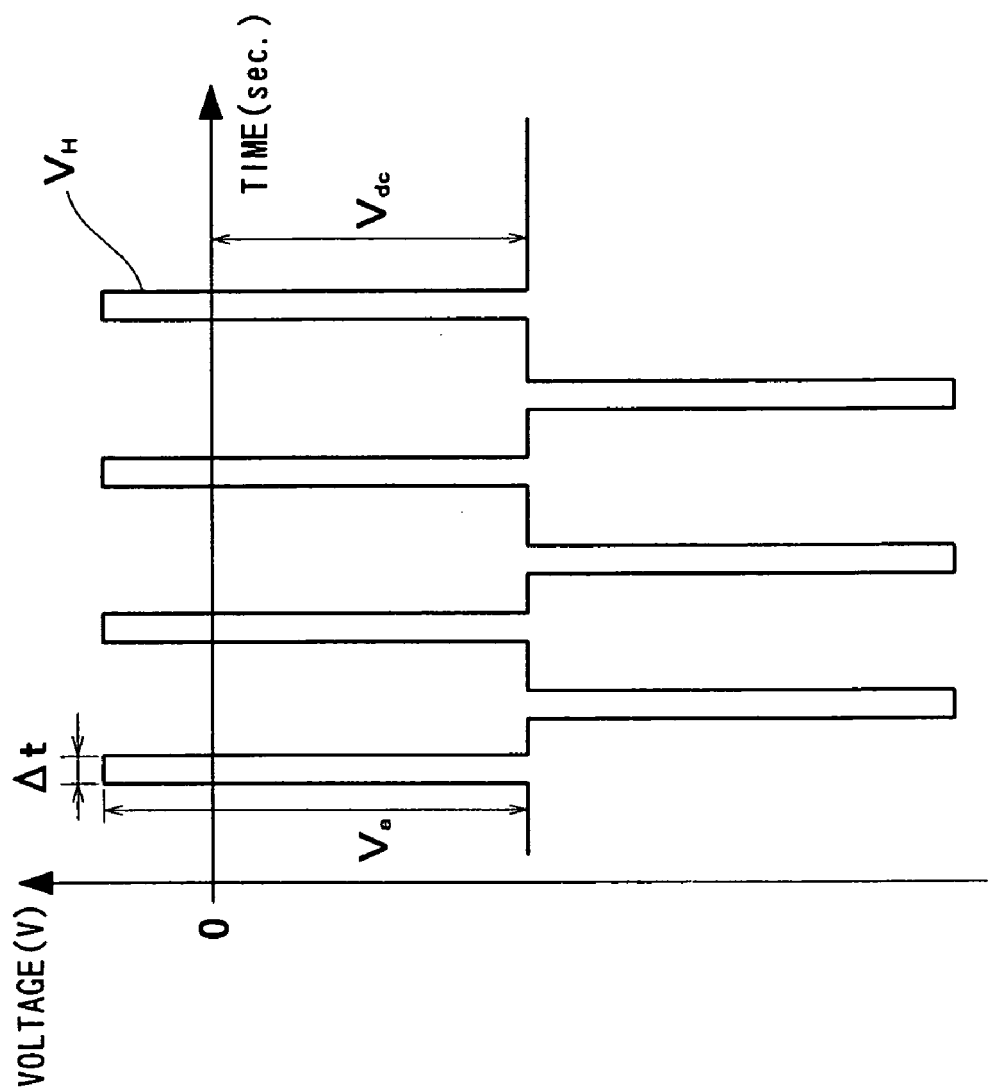
FIG. 18 is a graph showing variations in the electric potential of the substrate holder shown in FIG. 1.

FIG. 18 is a graph showing variations in the electric potential of the substrate holder 2 shown in FIG. 1A. When the radio frequency power supply unit of the subject vacuum film deposition system is actuated to supply a radio frequency power into the vacuum chamber 1, the electric potential of the substrate 2 varies like an oscillating wave that oscillates with an amplitude $V_a$ from a substantially constant negative voltage $V_{dc}$ serving as a center. The frequency of this oscillating wave is equal to or an integer multiple of the frequency (usually 13.56 MHz) of a radio frequency power outputted from the radio frequency power supply unit. The negative voltage $V_{dc}$ is considered to be a voltage corresponding to a self-bias that is generated in a usual case. At present, the mechanism based on which such a phenomenon occurs has not been elucidated yet. Since the amplitude $V_a$ of the oscillating wave is slightly larger than the negative voltage $V_{dc}$ in this vacuum film deposition system, the electric potential of the substrate holder 2 varies with a frequency equal to the frequency of a radio frequency power and periodically assumes a positive potential for a duration $\Delta t$. Thus, the subject vacuum film deposition system is capable of depositing a halogen compound thin film with lessened deficiency of the halogen element like the vacuum film deposition system shown in FIG. 1A. It should be noted that though the waveform of the foregoing oscillating wave in FIG. 18 is shown as a train of positive and negative alternate pulses, it is actually a sinusoidal wave. The positive potential duration $\Delta t$ is preferably 10 μs or less. On the other hand, the frequency of the oscillating wave is preferably within the range of from 13.56 MHz to 4×13.56 MHz.

As described above, the present invention is capable of depositing a film through ionization of a halogen compound as a film deposition system while allowing ions of the halogen element dissociated from ions of the halogen compound to be incorporated into the film being deposited, thereby making it possible to prevent the film from becoming deficient in the halogen element.

Thus, the present invention is capable of depositing a film through ionization of a halogen compound while preventing the film from becoming deficient in the halogen element, whereby the film thus deposited can be rendered dense and firm without impairment of the desired function.

Further, the present invention is capable of preventing an intended film from becoming deficient in a halogen element, which is not easy to supplement in the form of a reactive gas to be supplied into the vacuum chamber. In depositing a film of an oxide for example, it is possible to prevent the film from becoming deficient in oxygen by supplying oxygen gas to the film being deposited in the vacuum chamber. With the present invention, however, there is no need to supplement a halogen in the form of a reactive gas.

As described above, the present invention provides the effect of depositing a halogen film while preventing the film from becoming deficient in the halogen element thereby ensuring the halogen compound film without impairment of its desired function.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A film deposition method for depositing a halogen compound film, comprising the steps of:
    placing a substrate on an obverse side of a bias supply electrode disposed in a vacuum chamber;
    evaporating a film material comprising a halogen compound;
    supplying a radio frequency voltage to the bias supply electrode used as one of electrodes to generate plasma in the vacuum chamber; and
    applying to the bias supply electrode a bias voltage having a value varying, with time, in the form of a wave having a negative mean value and a positive maximum value exceeding a self-bias caused by the radio frequency voltage and adapted to cause the substrate to be at a negative potential,
    whereby the evaporated film material is ionized and deposited on the substrate to deposit the halogen compound film on the substrate.

2. The method according to claim 1, wherein the bias voltage is applied by a power supply.

3. The method according to claim 1, wherein the bias voltage applied is based on a voltage generated in a matching circuit provided for matching an impedance on a power supply side associated with the radio frequency voltage to that on a vacuum chamber side.

4. The method according to claim 1, wherein:
    an evaporation source is provided for evaporating the film material, while a coiled ionization electrode is disposed between the evaporation source and the substrate for supplying a radio frequency power; and
    the film material evaporated by the evaporation source is ionized by being passed through the coiled ionized electrode.

5. The method according to claim 1, wherein the film material comprising the halogen compound is evaporated and ionized in a clustered fashion by cluster ion generating means.

6. The method according to claim 1, wherein a substrate holder holding the substrate on its back surface in the vacuum chamber is formed of an electrically-conductive material and is used also as the bias supply electrode.

7. The method according to claim 1, wherein:
    an electron beam evaporation source is further provided comprising a crucible holding a material same as the halogen compound to be evaporated, an electron gun for evaporating the halogen compound held in the crucible by heating with an electron beam, and a shutter spaced a predetermined distance from the crucible in a direction toward the substrate; and
    the halogen compound in the crucible is evaporated by heating with the electron beam, while direct impingement of the halogen compound thus evaporated upon the substrate is obstructed with the shutter, whereby the evaporated halogen compound is guided sidewardly of the shutter and the crucible.

8. The method according to claim 1, wherein the halogen compound is magnesium fluoride ($MgF_2$).

9. The method according to claim 1, wherein the bias voltage has a frequency ranging between 100 kHz and 2.45 GHz.

10. The method according to claim 1, wherein the step of supplying the radio frequency voltage to the bias supply electrode and the step of applying to the bias supply electrode the bias voltage are performed at the same time.

11. The method according to claim 1, wherein:
    a portion of the ionized evaporated film material comprises positively charged ions of the halogen compound and negatively charged ions of a halogen element that has dissociated from the halogen compound;
    a combined negative potential due to the self-bias and the negative bias voltage applied to the bias supply electrode accelerates a movement of the positively charged ions toward the substrate; and,
    the positive bias voltage applied to the bias supply electrode incorporates the negatively charged ions into the halogen compound film deposited on the substrate.

* * * * *

UNITED STATES PATENT AND TRADEMARK OFFICE
CERTIFICATE OF CORRECTION

PATENT NO. : 7,223,449 B2  Page 1 of 1
APPLICATION NO. : 10/858178
DATED : May 29, 2007
INVENTOR(S) : Takanobu Hori et al.

It is certified that error appears in the above-identified patent and that said Letters Patent is hereby corrected as shown below:

On the Title Page Item (73)
1st Assignee, "lakarazuka-shi" should be -- Takarazuka-shi --.

Signed and Sealed this

Fourth Day of December, 2007

JON W. DUDAS
*Director of the United States Patent and Trademark Office*